US008788254B2

(12) United States Patent
Peloski

(10) Patent No.: US 8,788,254 B2
(45) Date of Patent: Jul. 22, 2014

(54) MONITORING AND CONTROL OF CONTACT CENTERS WITH DYNAMIC TEMPORAL DIMENSION

(71) Applicant: Aria Solutions, Inc., Calgary (CA)

(72) Inventor: Paul Peloski, Calgary (CA)

(73) Assignee: Aria Solutions, Inc., Calgary (CA)

(*) Notice: Subject to any disclaimer, the term of this patent is extended or adjusted under 35 U.S.C. 154(b) by 0 days.

(21) Appl. No.: 13/934,149

(22) Filed: Jul. 2, 2013

(65) Prior Publication Data

US 2014/0046638 A1 Feb. 13, 2014

Related U.S. Application Data

(63) Continuation of application No. 13/839,725, filed on Mar. 15, 2013, now abandoned, which is a continuation-in-part of application No. 13/792,058, filed on Mar. 9, 2013, now Pat. No. 8,631,034.

(60) Provisional application No. 61/682,756, filed on Aug. 13, 2012.

(51) Int. Cl.
G06F 17/50 (2006.01)
G06G 7/62 (2006.01)

(52) U.S. Cl.
USPC .......... 703/13; 703/6; 703/17; 707/769; 707/706; 707/713; 707/736; 707/758; 705/7.11; 705/7.35; 705/348

(58) Field of Classification Search
USPC .................................. 703/6, 13
See application file for complete search history.

(56) References Cited

U.S. PATENT DOCUMENTS

| 5,963,731 | A  | * | 10/1999 | Sagawa et al. ............. 703/6 |
| 6,931,392 | B1 | * | 8/2005  | Skeen ......................... 1/1 |
| 7,103,562 | B2 | * | 9/2006  | Kosiba et al. ............ 705/7.38 |
| 7,158,628 | B2 | * | 1/2007  | McConnell et al. ...... 379/265.02 |
| 7,539,627 | B2 | * | 5/2009  | Schmidt ..................... 705/7.16 |
| 7,761,828 | B2 | * | 7/2010  | Miczo ......................... 716/103 |

(Continued)

OTHER PUBLICATIONS

Filippoupolitis et al, "A Distributed Decision Support System for Building Evacuation", HIS, May 21-23, 2009.*

(Continued)

Primary Examiner — Mary C Jacob
(74) Attorney, Agent, or Firm — Galvin Patent Law LLC; Brian R. Galvin

(57) ABSTRACT

A system with a dynamic temporal dimension for monitoring and control of contact centers, comprising: a scalable simulation service configured with a virtual environment that replicates and is maintained in synchrony with a production contact center environment; an analysis manager; a persistent query service; and a visualizer. The persistent query service receives data from contact center systems and updates virtual tables based on the updates; the analysis manager, sends real-time updates to the visualizer, and the visualizer updates a visualization provided to a user by displaying the real-time updates as a set of past states; and the scalable simulation service performs a time-warped simulation to compute at least a future state of one of the virtual environments and sends a second plurality of updates to the visualizer, and the visualizer updates the visualization provided to the user by displaying the second plurality of real-time updates as a projected future state.

2 Claims, 18 Drawing Sheets

(56) References Cited

U.S. PATENT DOCUMENTS

| | | | |
|---|---|---|---|
| 7,945,637 B2* | 5/2011 | Van Vleet et al. | 709/217 |
| 7,949,552 B2* | 5/2011 | Korenblit et al. | 705/7.13 |
| 8,204,870 B2* | 6/2012 | Mukkamala et al. | 707/705 |
| 8,464,278 B2 | 6/2013 | Nesamoney | |
| 2004/0017403 A1 | 1/2004 | Andersson | |
| 2009/0106214 A1* | 4/2009 | Jain et al. | 707/4 |
| 2010/0082656 A1* | 4/2010 | Jing et al. | 707/760 |

OTHER PUBLICATIONS

Acharya et al, "A Scalable Middleware for Presence Virtualization and Federation", Computer Science, Apr. 27, 2009.*

Ballard et al, "Business Performance Management . . . Meets Business Intelligence", IBM Redbooks, Jul. 2005.*

Tanir et al, "Call Center Simulation in Bell Canada", Proceedings of the 1999 Winter Simulation Conference, 1999.*

* cited by examiner

MONITORING AND CONTROL OF CONTACT CENTERS WITH DYNAMIC TEMPORAL DIMENSION

CROSS-REFERENCE TO RELATED APPLICATIONS

This application is a continuation of U.S. patent application Ser. No. 13/839,725, titled "MONITORING AND CONTROL OF CONTACT CENTERS WITH DYNAMIC TEMPORAL DIMENSION", which is a continuation-in-part of U.S. patent application Ser. No. 13/792,058, titled "HIGH PERFORMANCE REAL-TIME RELATIONAL DATABASE SYSTEM AND METHODS FOR USING SAME", filed on Mar. 9, 2013, which claims priority to U.S. patent application Ser. No. 61/682,756, filed on Aug. 13, 2012, the entire specifications of each of which is hereby incorporated by reference in its entirety. This application is related to co-pending and co-owned U.S. patent application Ser. No. 12/804,750, titled "SYSTEM AND METHOD FOR TIME VIRTUALIZATION IN COMPUTER SYSTEMS", which was filed on Jul. 27, 2010, the entire specification of which is hereby incorporated by reference in its entirety.

BACKGROUND OF THE INVENTION

1. Field of the Invention

The invention relates to the field of operations management systems, and particularly to the field of advanced real-time monitoring and control systems using a dynamic temporal dimension.

2. Discussion of the State of the Art

Business reporting or enterprise reporting is a fundamental part of identifying the capabilities and performance metrics within an organization to convert into knowledge to improve efficiency and overall performance of people, systems and processes within the organization. To support better business decision-making, businesses rely on large amounts of information (for example, transactional log files, system configuration information, human resource information, customer transaction data, path analytics, etc.) produced by management systems that provides managers with information about sales, inventories, and other data that would help in managing and improving the enterprise.

With the dramatic expansion of information technology, and a desire for increased competitiveness in corporations, there has been an enormous increase in the capture of large datasets representing every facet of business processing, customer transactions, and other data to understand and improve how the business functions (often referred to as 'Big Data'). As such, computing power to produce unified reports (for example, those that join different views of the enterprise in one place) has increased exponentially. This reporting process involves querying data sources with different logical models to produce a human readable report. For example, in a customer service communication center environment, a manager may query a human resources database, an employee performance database, a set of transactional logs, and real-time metrics to identify where resources may require improvement and further training.

The problem with systems known in the art is that the cause of inefficiencies that appear in many complex interaction management systems, issues are never fully understood or the true cause understood or remedied due to the nature of how large datasets are presented which is typically as linear text files that are often many gigabytes in size. Using such a mechanism becomes prohibitive for human analysis and understanding. Furthermore, the ability to move to focus to a point in time of when the issue happened is not coherent when using a text file interface.

To remedy this situation, various techniques have been tried in the art, for example, a tabular presentation of data, or a collection of common objects and color coding text elements; however, this only provides a very limited improvement in data analysis of large complex data sets.

What is needed is a highly responsive system and methods to provide a graphical representation that enable users to better understand the data and use it to achieve tactical and strategic objectives. Furthermore a system that provides the ability to generate simulation data based on a knowledge of the behavior of the environment and give the ability for users to perform experimentation by changing system parameters in a controlled environment would increase the efficiency of businesses with large complex data sets.

SUMMARY OF THE INVENTION

Accordingly, the inventor has conceived and reduced to practice, in a preferred embodiment of the invention, a system for monitoring and control of contact centers with dynamic temporal dimension, and various methods of using the same.

According to a preferred embodiment of the invention, a system with a dynamic temporal dimension for monitoring and control of contact centers is disclosed, comprising: a scalable simulation service stored and operating on a plurality of network-attached computers and configured with a virtual environment that replicates and is maintained in synchrony with a production contact center environment; an analysis manager stored and operating on a network-attached computer; a persistent query service stored and operating on a plurality of network-attached computers and coupled to a network-attached data store; and a visualizer stored and operating on a network-connected computer. According to the embodiment, the persistent query service receives data from a plurality of contact center systems and updates a plurality of virtual tables based at least on the received data updates; the analysis manager, based at least on changes in one or more persistent queries, sends a first plurality of real-time updates to the visualizer and the visualizer thereupon updates a first visualization provided to a user of the state of a production contact center by displaying the first plurality of real-time updates as a set of past states of the production contact center environment; and the scalable simulation service, based at least on changes in one or more persistent queries, performs a time-warped simulation to compute at least a future state of one of the virtual environments and sends a second plurality of real-time updates to the visualizer and the visualizer thereupon updates the first visualization provided to the user by displaying the second plurality of real-time updates as a projected future state of the production contact center environment. The visualizer updates the first visualization based at least on the time-warped simulation such that all data visualization corresponding to a time before a first cutover time is based on actual data According to another preferred embodiment of the invention, a method for monitoring and control of contact centers with a dynamic temporal dimension is disclosed, comprising the steps of: (a) receiving, at a persistent query service stored and operating on a plurality of network-attached computers and coupled to a network-attached data store, data from a plurality of contact center systems; (b) updating a plurality of virtual tables based at least on the received data updates; (c) sending, using an analysis manager stored and operating on a network-attached computer, based at least on changes in one or more persistent queries, a first plurality of real-time updates to a visualizer stored and operating on a network-connected computer; (d) updating, by the visualizer, a first visualization provided to a user of the state of a production contact center by displaying the first plurality of real-time updates as a set of past states of the production contact center environment; (e) performing, using a scalable simulation service stored and operating on a plurality of network-attached computers and configured with a virtual environment that replicates and is maintained in synchrony with a production contact center environment, a time-warped simulation to compute at least a future state of one of the virtual environments based at least on changes in one or more persistent queries; (f) sending the second plurality of real-time updates to the visualizer; and (g) updating, by the visualizer, the first visualization provided to the user by displaying the second plurality of real-time updates as a projected future state of the production contact center environment.

BRIEF DESCRIPTION OF THE DRAWING FIGURES

The accompanying drawings illustrate several embodiments of the invention and, together with the description, serve to explain the principles of the invention according to the embodiments. One skilled in the art will recognize that the particular embodiments illustrated in the drawings are merely exemplary, and are not intended to limit the scope of the present invention.

DETAILED DESCRIPTION

Figure 1:
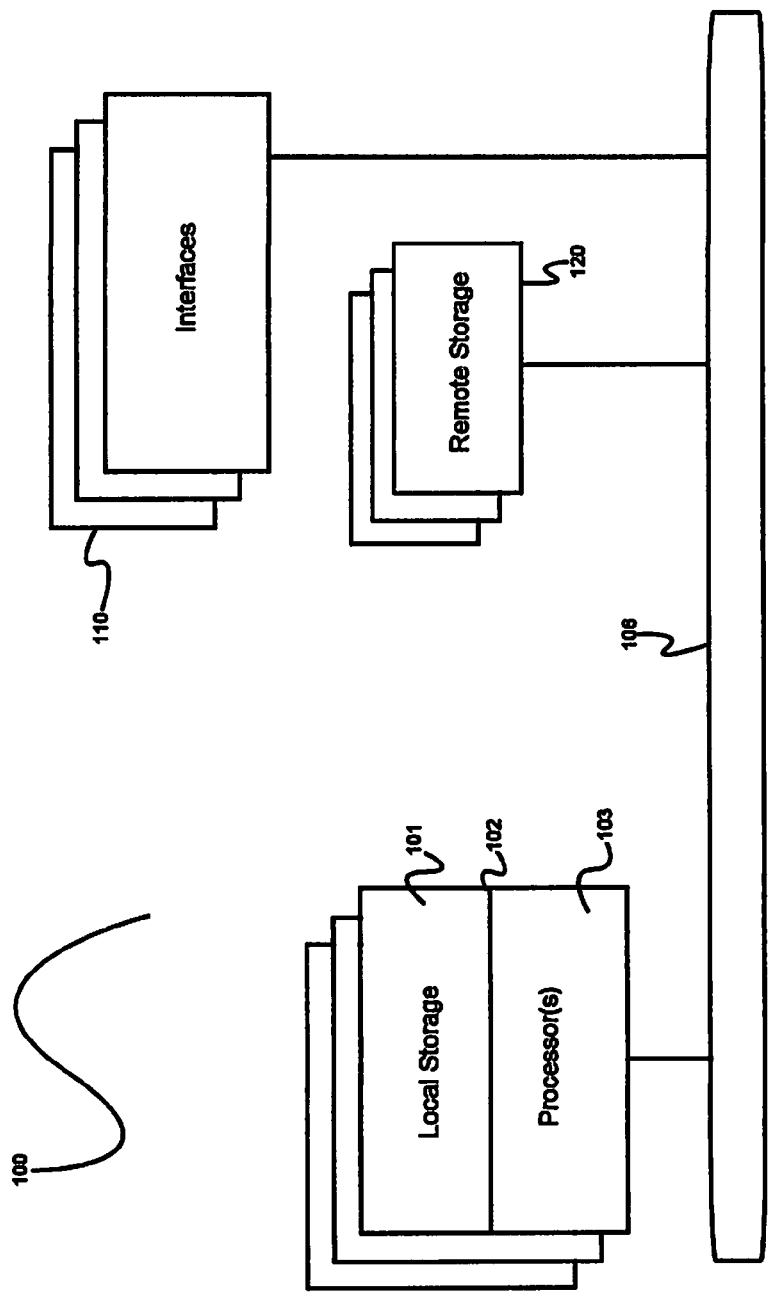
FIG. 1 is a block diagram illustrating an exemplary hardware architecture of a computing device used in an embodiment of the invention.

The inventor has conceived, and reduced to practice, a high-performance real-time relational database system, and various methods for using the same. Systems deployed in accordance with one or more embodiments of the invention will generally be easily extensible to handle new interaction types and other activities such as work items or eLearning modules, that may require routing, and will be suitable for use in a wide range of deployment architectures, including particularly cloud-based routing architectures that manage routing of interactions for a large number of agents across a large number of enterprises.

One or more different inventions may be described in the present application. Further, for one or more of the inventions described herein, numerous alternative embodiments may be described; it should be understood that these are presented for illustrative purposes only. The described embodiments are not intended to be limiting in any sense. One or more of the inventions may be widely applicable to numerous embodiments, as is readily apparent from the disclosure. In general, embodiments are described in sufficient detail to enable those skilled in the art to practice one or more of the inventions, and it is to be understood that other embodiments may be utilized and that structural, logical, software, electrical and other changes may be made without departing from the scope of the particular inventions. Accordingly, those skilled in the art will recognize that one or more of the inventions may be practiced with various modifications and alterations. Particular features of one or more of the inventions may be described with reference to one or more particular embodiments or figures that form a part of the present disclosure, and in which are shown, by way of illustration, specific embodiments of one or more of the inventions. It should be understood, however, that such features are not limited to usage in the one or more particular embodiments or figures with reference to which they are described. The present disclosure is neither a literal description of all embodiments of one or more of the inventions nor a listing of features of one or more of the inventions that must be present in all embodiments.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more intermediaries, logical or physical.

A description of an embodiment with several components in communication with each other does not imply that all such components are required. To the contrary, a variety of optional components may be described to illustrate a wide variety of possible embodiments of one or more of the inventions and in order to more fully illustrate one or more aspects of the inventions. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence.

When a single device or article is described, it will be readily apparent that more than one device or article may be used in place of a single device or article. Similarly, where more than one device or article is described, it will be readily apparent that a single device or article may be used in place of the more than one device or article.

The functionality or the features of a device may be alternatively embodied by one or more other devices that are not explicitly described as having such functionality or features. Thus, other embodiments of one or more of the inventions need not include the device itself.

Techniques and mechanisms described or referenced herein will sometimes be described in singular form for clarity. However, it should be noted that particular embodiments include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of embodiments of the present invention in which, for example, functions may be executed out of order from that shown or discussed, including substantially concurrently or in reverse order, depending on the functionality involved, as would be understood by those having ordinary skill in the art.

DEFINITIONS

As used herein, "Extract, Transform and Load (ETL)" means a process to migrate data from one database to another, to form data marts, data warehouses and to convert databases from one format or type to another. The ETL function is made up of three steps. Extract is the process of reading data from a database. Transform is the process of converting the extracted data from its previous form into the form it needs to be in so that it can be placed into another database. Transformation occurs by using rules or lookup tables or by combining the data with other data. Load is the process of writing the data into the target database.

As used herein, a "persistent query service" is a database system supporting persistent queries and comprising a client software application operating on a computer comprising at least a listener comprising client code to be executed when the listener is invoked; a persistent query service stored and operating on a network-attached computer adapted to receive connections and requests from the client software application; and a plurality of network-attached data sources. On receiving a request to create a persistent query from the client software application, the persistent query service: creates a query virtual table corresponding to the persistent query; parses the persistent query to create a tree structure representing a logical arrangement of a plurality of operators that yield results required by the persistent query; creates a plurality of intermediate virtual tables corresponding to the plurality of operators, wherein the step of creating an intermediate virtual table further comprises establishing listeners associated with the intermediate virtual table to receive data change notifications; establishes listeners for the query virtual table to receive data change notifications from a plurality of intermediate virtual tables; creates a plurality of data source virtual tables, each corresponding to a specific data source required to fulfill the persistent query; causes the plurality of data source virtual tables to retrieve initial data from the plurality of data sources; and propagates data via the plurality of intermediate virtual tables and their associated listeners to the persistent query virtual table. On detection of a data change in a data source, the associated data source virtual table invokes a plurality of corresponding methods of listeners of a plurality of virtual intermediate tables and propagates the data change via the plurality of intermediate virtual tables and their associated listeners to the persistent query virtual table, and the client software application executes the client code of at least one affected listener.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be disclosed herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, and the like), a consumer electronic device, a music player, or any other suitable electronic device, router, switch, or the like, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or the like).

Referring now to FIG. 1, there is shown a block diagram depicting an exemplary computing device 100 suitable for implementing at least a portion of the features or functionalities disclosed herein. Computing device 100 may be, for example, any one of the computing machines listed in the previous paragraph, or indeed any other electronic device capable of executing software- or hardware-based instructions according to one or more programs stored in memory. Computing device 100 may be adapted to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 100 includes one or more central processing units (CPU) 102, one or more interfaces 110, and one or more busses 106 (such as a peripheral component interconnect (PCI) bus). When acting under the control of appropriate software or firmware, CPU 102 may be responsible for implementing specific functions associated with the functions of a specifically configured computing device or machine. For example, in at least one embodiment, a computing device 100 may be configured or designed to function as a server system utilizing CPU 102, local memory 101 and/or remote memory 120, and interface(s) 110. In at least one embodiment, CPU 102 may be caused to perform one or more of the different types of functions and/or operations under the control of software modules or components, which for example, may include an operating system and any appropriate applications software, drivers, and the like.

CPU 102 may include one or more processors 103 such as, for example, a processor from one of the Intel, ARM, Qualcomm, and AMD families of microprocessors. In some embodiments, processors 103 may include specially designed hardware such as application-specific integrated circuits (ASICs), electrically erasable programmable read-only memories (EEPROMs), field-programmable gate arrays (FPGAs), and so forth, for controlling operations of computing device 100. In a specific embodiment, a local memory 101 (such as non-volatile random access memory (RAM) and/or read-only memory (ROM), including for example one or more levels of cached memory) may also form part of CPU 102. However, there are many different ways in which memory may be coupled to system 100. Memory 101 may be used for a variety of purposes such as, for example, caching and/or storing data, programming instructions, and the like.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 110 are provided as network interface cards (NICs). Generally, NICs control the sending and receiving of data packets over a computer network; other types of interfaces 110 may for example support other peripherals used with computing device 100. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, Firewire™, PCI, parallel, radio frequency (RF), Bluetooth™, near-field communications (e.g., using near-field magnetics), 802.11 (WiFi), frame relay, TCP/IP, ISDN, fast Ethernet interfaces, Gigabit Ethernet interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 110 may include ports appropriate for communication with appropriate media. In some cases, they may also include an independent processor and, in some in stances, volatile and/or non-volatile memory (e.g., RAM).

Although the system shown in FIG. 1 illustrates one specific architecture for a computing device 100 for implementing one or more of the inventions described herein, it is by no means the only device architecture on which at least a portion of the features and techniques described herein may be implemented. For example, architectures having one or any number of processors 103 may be used, and such processors 103 may be present in a single device or distributed among any number of devices. In one embodiment, a single processor 103 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 120 and local memory 101) configured to store data, program instructions for the general-purpose network operations, or other information relating to the functionality of the embodiments described herein (or any combinations of the above). Program instructions may control execution of or comprise an operating system and/or one or more applications, for example. Memory 120 or memories 101, 120 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory, solid state drives, memristor memory, random access memory (RAM), and the like. Examples of program instructions include both object code, such as may be produced by a compiler, machine code, such as may be produced by an assembler or a linker, byte code, such as may be generated by for example a Java™ compiler and may be executed using a Java virtual machine or equivalent, or files containing higher level code that may be executed by the computer using an interpreter (for example, scripts written in Python, Perl, Ruby, Groovy, or any other scripting language).

Figure 2:
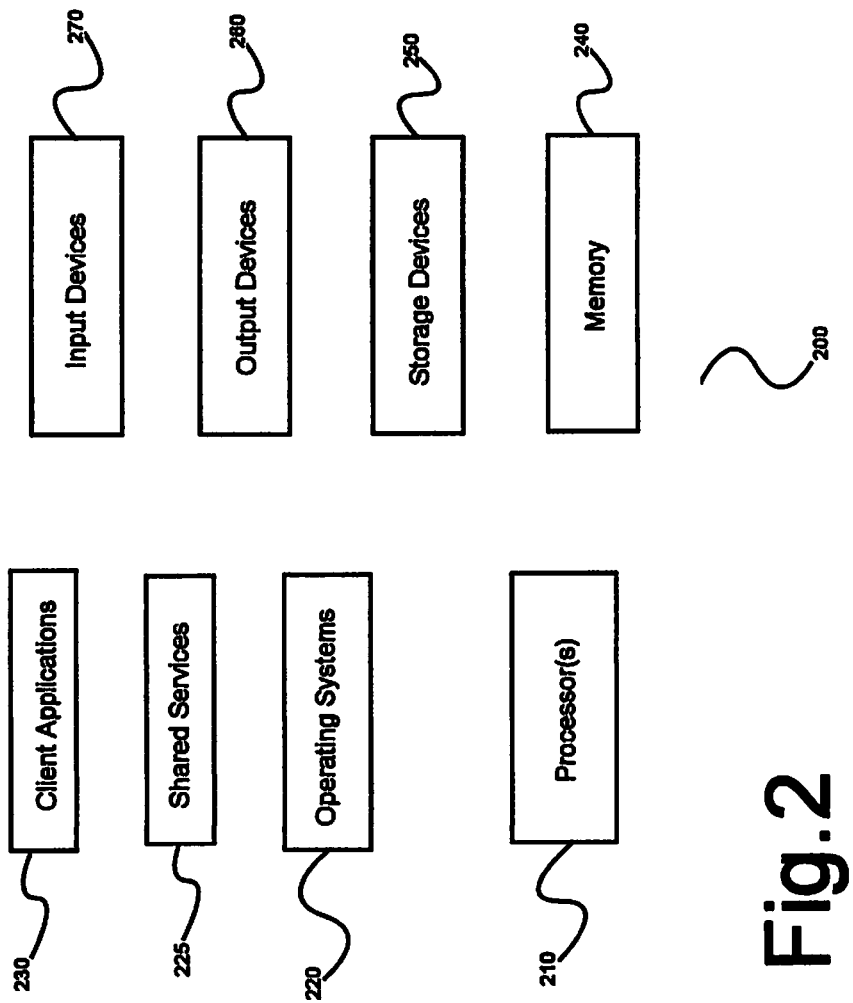
FIG. 2 is a block diagram illustrating an exemplary logical architecture for a client device, according to an embodiment of the invention.

In some embodiments, systems according to the present invention may be implemented on a standalone computing system. Referring now to FIG. 2, there is shown a block diagram depicting a typical exemplary architecture of one or more embodiments or components thereof on a standalone computing system. Computing device 200 includes processors 210 that may run software that carry out one or more functions or applications of embodiments of the invention, such as for example a client application 230. Processors 210 may carry out computing instructions under control of an operating system 220 such as, for example, a version of Microsoft's Windows™ operating system, Apple's Mac OS/X or iOS operating systems, some variety of the Linux operating system, Google's Android™ operating system, or the like. In many cases, one or more shared services 225 may be operable in system 200, and may be useful for providing common services to client applications 230. Services 225 may for example be Windows™ services, user-space common services in a Linux environment, or any other type of common service architecture used with operating system 210. Input devices 270 may be of any type suitable for receiving user input, including for example a keyboard, touchscreen, microphone (for example, for voice input), mouse, touchpad, trackball, or any combination thereof. Output devices 260 may be of any type suitable for providing output to one or more users, whether remote or local to system 200, and may include for example one or more screens for visual output, speakers, printers, or any combination thereof. Memory 240 may be random-access memory having any structure and architecture known in the art, for use by processors 210, for example to run software. Storage devices 250 may be any magnetic, optical, mechanical, memristor, or electrical storage device for storage of data in digital form. Examples of storage devices 250 include flash memory, magnetic hard drive, CD-ROM, and/or the like.

Figure 3:
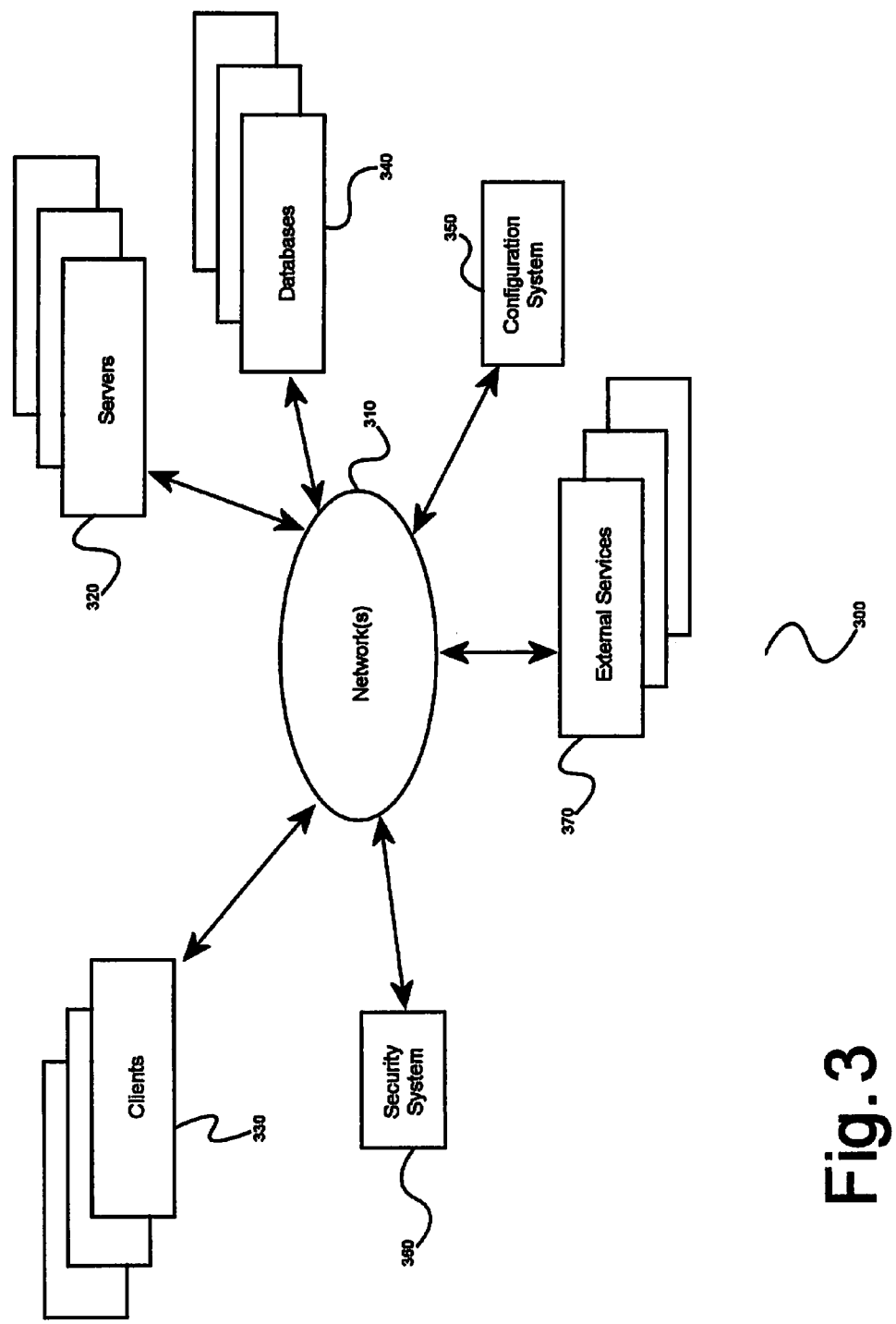
FIG. 3 is a block diagram showing an exemplary architectural arrangement of clients, servers, and external services, according to an embodiment of the invention.

In some embodiments, systems of the present invention may be implemented on a distributed computing network, such as one having any number of clients and/or servers. Referring now to FIG. 3, there is shown a block diagram depicting an exemplary architecture for implementing at least a portion of a system according to an embodiment of the invention on a distributed computing network. According to the embodiment, any number of clients 330 may be provided. Each client 330 may run software for implementing client-side portions of the present invention; clients may comprise a system 200 such as that illustrated in FIG. 2. In addition, any number of servers 320 may be provided for handling requests received from one or more clients 330. Clients 330 and servers 320 may communicate with one another via one or more electronic networks 310, which may be in various embodiments any of the Internet, a wide area network, a mobile telephony network, a wireless network (such as WiFi, Wimax, and so forth), or a local area network (or indeed any network topology known in the art; the invention does not prefer any one network topology over any other). Networks 310 may be implemented using any known network protocols, including for example wired and/or wireless protocols.

In addition, in some embodiments, servers 320 may call external services 370 when needed to obtain additional information, or to refer to additional data concerning a particular call. Communications with external services 370 may take place, for example, via one or more networks 310. In various embodiments, external services 370 may comprise web-enabled services or functionality related to or installed on the hardware device itself. For example, in an embodiment where client applications 230 are implemented on a smartphone or other electronic device, client applications 230 may obtain information stored in a server system 320 in the cloud or on an external service 370 deployed on one or more of a particular enterprise's or user's premises.

In some embodiments of the invention, clients 330 or servers 320 (or both) may make use of one or more specialized services or appliances that may be deployed locally or remotely across one or more networks 310. For example, one or more databases 340 may be used or referred to by one or more embodiments of the invention. It should be understood by one having ordinary skill in the art that databases 340 may be arranged in a wide variety of architectures and using a wide variety of data access and manipulation means. For example, in various embodiments one or more databases 340 may comprise a relational database system using a structured query language (SQL), while others may comprise an alternative data storage technology such as those referred to in the art as "NoSQL" (for example, Hadoop Cassandra, Google BigTable, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most embodiments of the invention may make use of one or more security systems 360 and configuration systems 350. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 360 or configuration system 350 or approach is specifically required by the description of any specific embodiment.

In various embodiments, functionality for implementing systems or methods of the present invention may be distributed among any number of client and/or server components. For example, various software modules may be implemented for performing various functions in connection with the present invention, and such modules can be variously implemented to run on server and/or client components.

Conceptual Architecture

Figure 4:
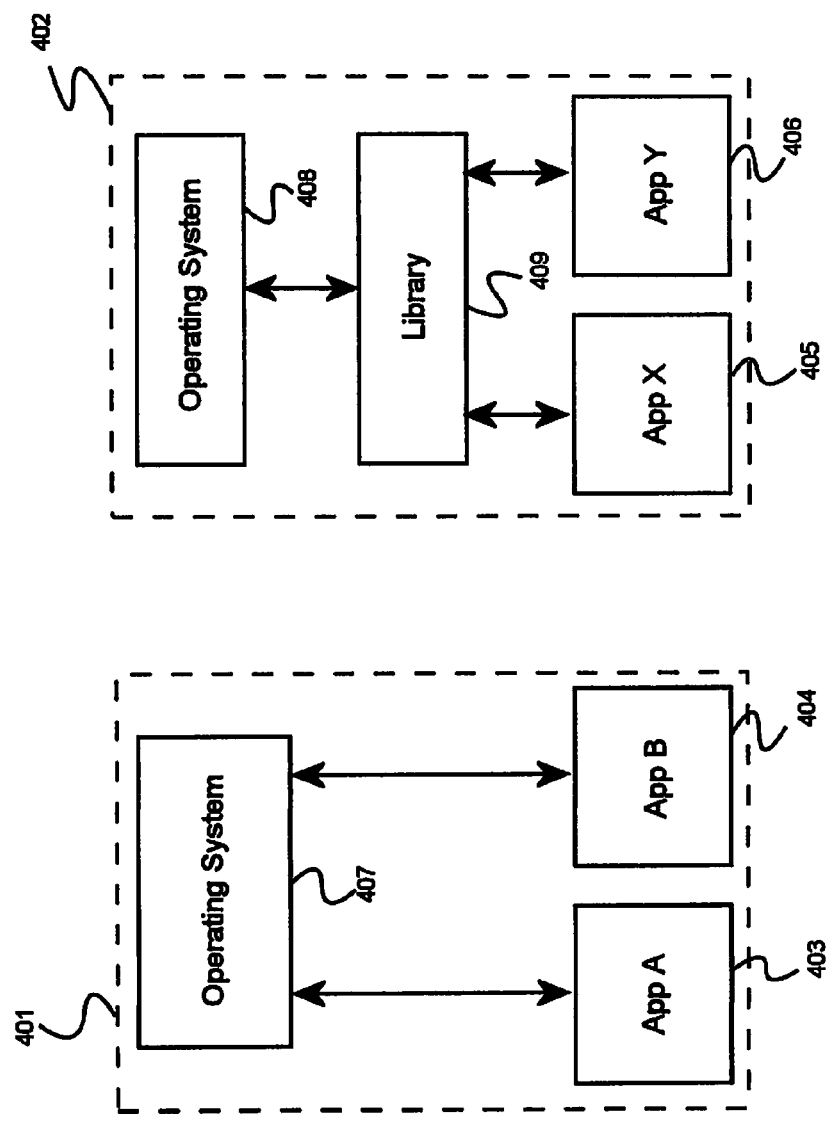
FIG. 4 is a block diagram of two servers illustrating an example of prior art whereby higher level applications communicate with an operating system.

FIG. 4 provides an exemplary illustration of prior art systems and methods in which time-dependent functions are used. Applications, whether specialized software applications running on a general-purpose computer, dedicated applications running on a specialized computer system, or an application embedded as circuitry in silicon, often require access to a reliable system clock to conduct their work. For example, in computer 401, applications A 403 and B 404 may require access to a system clock in order to calculate rates (how much something happens, changes, or moves per unit time), intervals (how long between event 1 and event 2), and scheduled event sequences (for example, let me know when 60 milliseconds have passed, so I can execute a timeout function). In order to use time as a variable, often applications will make function calls against built-in operating system 407 functions. In essentially all digital and analog computers, an underlying operating system 407 (also 408 in a second example) is used to manage low-level system functions, one of which is a system clock (usually, but not necessarily, implemented as a piece of dedicated low-level code within operating system 407, 408 that takes advantage of the central processing unit's hard-wired clock functions). Examples of operating systems include various flavors of Unix™, Linux™, Windows™, Mac OS™, although there are many other less well-known operating systems, including operating systems that are embedded in silicon (that is, that do not rely on any separable software but are built into circuitry directly). All operating systems have built-in system clocks and a set of time-dependent functions that may be called by applications 403-406 running within, or "on", the operating system. For the purposes of this application, "operating system" is not limited to any particular commercial operating system such as Windows™ and, all illustrations being exemplary in nature, nothing in this application should be construed as limiting the application of the invention to any applications running on any operating system.

Further, in some cases applications, such as application X 405 and application Y 406, run on a computer 402 that operates under control of an operating system 408, but do not directly invoke operating system 408 functions for time-dependent functions, but rather rely on some other low-level library 409 for access to these functions. For example, some time-dependent functions are contained in a standard C library referred to in the art as libc. Functions such as date( ), sleep( ), and the like can be called by programs written in C (or programs written in languages that use libc, such as interpreted languages like Perl). In these cases, applications 407-408 in the art make calls to libc that are then passed as needed to the underlying operating system 408 as needed in a way that is not visible or useful to the requesting application 405-406. There are many arrangements such as that illustrated in the right side of FIG. 4, including those that involve use of the Java language; in these cases the identity of library 409 will depend on the language and computer architecture chosen. Additionally, in some cases applications 403-406 use a mixed mode for handling time-dependent calls (that is, "function calls"), sometimes going directly to the operating system 407-408 and sometimes going through an intermediate library 409; it will be appreciated by one having ordinary skill the art of computer architectures and computer programming that there are many ways in which applications can access time-dependent functions in order to carry out their instructions, all of which depend on a "real time system clock", that is, a clock which is synchronized with actual clock time for the location in which the computer is operating (although many computer systems ignore time zones and operate instead using universal computer time, we need not consider time zone effects at all for the purposes of this application, as the issue herein pertains to time virtualization, or more specifically an intentional change in a time scale used within affected applications such that time passes "for the application" more or less quickly than it does in real time (i.e., for a real observer), without the application's "being aware" of the change and, importantly, without requiring the application to be changed in any way (while such time warping will normally be done to "speed up time", time virtualization systems and methods according to the present invention can as easily cause virtual time to pass more slowly than real time within an application.

Figure 5:
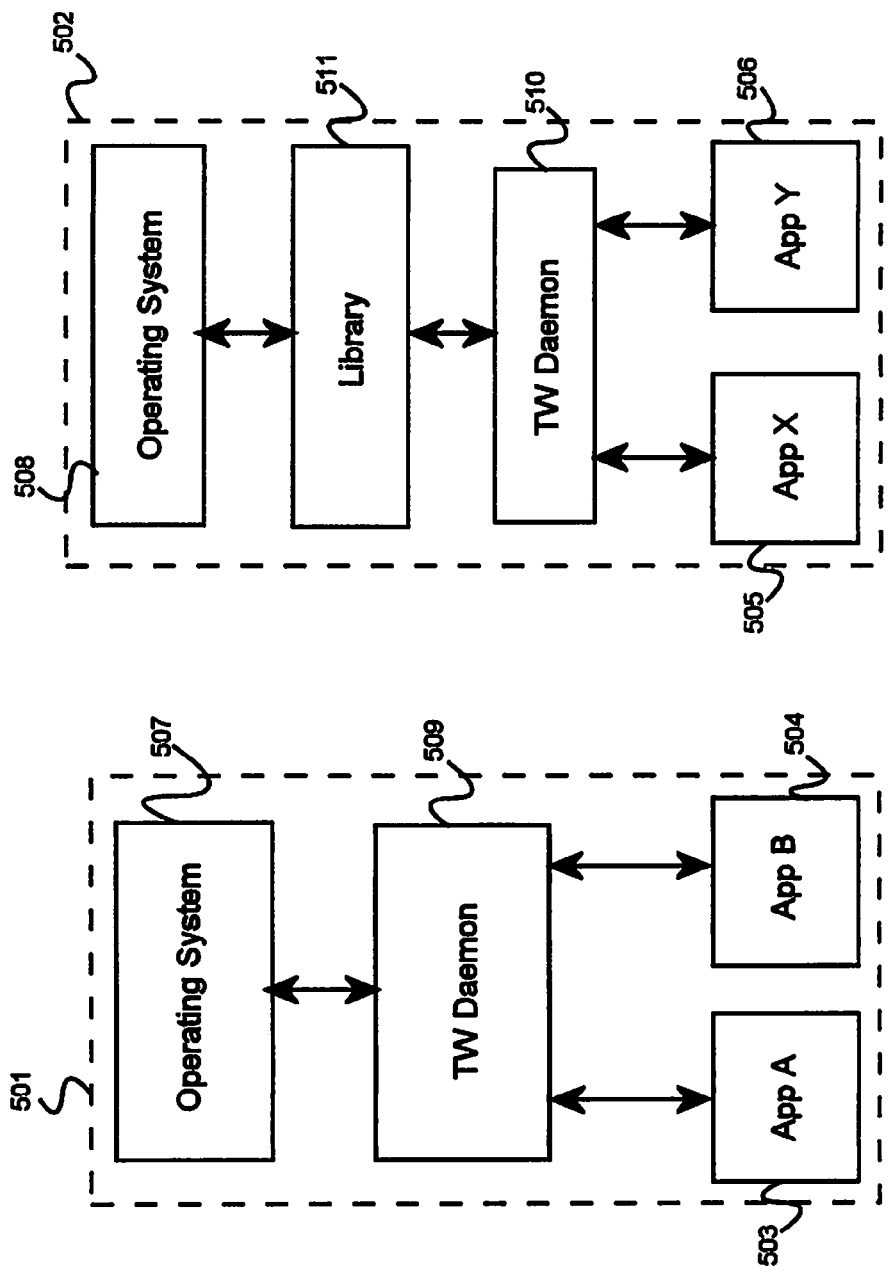
FIG. 5 is a block diagram of an embodiment of the invention incorporating a time warp daemon process in the server.

A key aspect of the present invention is the interception of time-dependent function or method calls to an operating system 407, 408 or library 409. In a preferred embodiment of the invention illustrated in FIG. 5, computers 501, 502 operate analogously to those in FIG. 4, except time-dependent function or method calls to operating systems 507, 508 or library 511 are intercepted by a time warp daemon 509, 510. That is, time-dependent function or method calls that would normally have been sent to an operating system 507, 508 or a library 511 such as libc are instead redirected to a time warp daemon 509, 510. There are many ways in which such a redirection can be accomplished. According to an embodiment of the invention, time-dependent function or method calls are redirected using a principle referred to in the art as dynamic linking. "Linking" is a function that links functions or methods stored in separate files or libraries to a particular executable application. In many cases, applications are linked with desired libraries and functions, using static linking, at compile time. But in other cases, linking is performed dynamically at run time. An advantage to dynamic linking is that it generally allows common libraries and functions to be maintained once, even if they are used by many applications. For example, in Windows™-based computers, many functions or methods are deployed as dynamic-loaded libraries or "DLLs", allowing updates to be made to them without requiring recompilation of programs that depend on them. Another method of dynamic linking, common on UNIX™ and Linux™-based machines, is through use of a built-in dynamic loader, which is configured via environment variables such as LD_PRELOAD. It will be appreciated by those having ordinary skill in the art of modern computer programming that there are many methods, including others not based on dynamic linking, for "intercepting" a function call directed to one library and instead handling it with a different library.

In a preferred embodiment of the invention, a dynamic linker is configured using a LD_PRELOAD environment variable to redirect all calls to libc to a time warp daemon 509, 510, so that all time-dependent functions accessed by programs will run through time warp daemon 509, 510 instead of a standard libc library (which normally is very closely tied to the system clock). In the embodiment, time-dependent function interception is carried out in user space, and affects only applications running within an affected user space. In some embodiments, other libraries or a plurality of libraries containing time-dependent functions or methods are handled via analogous redirections; for instance, calls to glibc may be intercepted instead of, or in addition to, calls to libc, and so on. In yet other embodiments, time warp daemon 509, 510 may be implemented as a kernel-level library and intercept system-level time-dependent calls. Such an approach is advantageous in that it would work with applications that make direct calls to kernel-level time-dependent functions instead of or in addition to calls to user space libraries 511 such as libc or glibc, but require kernel-level patching and is therefore not always necessary or desirable for a particular purpose. For example, in order to support time-warped simulation involving unmodified third-party applications (such as applications A 503, B 504, X 505, or Y 506 in FIG. 5), it is often adequate to intercept user space time-dependent functions via library 511 rather than intercepting calls going to system space functions resident in operating system 507, since applications 503-506 generally execute in user space and would thus be aware only of time as exposed via library 511.

In some embodiments, an entire machine may be run on virtualized time using a system or method according to the invention. For instance, if computer 501 runs operating system 507 and all time-dependent functions from applications 503-504 are intercepted by time warp daemon 509, then in effect time warp daemon 509 will provide a virtualized time to all functions running on computer 501. This may be advantageous, as time virtualization will effectively maximize utilization of computing resources on computer 501. A limitation of such system-wide time virtualization is that, if the system interacts in real time with other systems, and clock time is an important aspect of interactions between the system and other non-time-warped (or differently time-warped) systems, then time warping would be disadvantageous (as the systems could lead to unexpected and inaccurate results. However, simulation is only one example of a process type where virtualizing time would be advantageous. Other examples would be systems which normally experience light loading but on occasion experience heavy peaks in load, and which interact with other systems asynchronously and without actual clock time's being an important parameter (in such systems, time virtualization would allow the machine to run at full utilization always, with virtual time speeding up and slowing down—as described in detail below—based on changes in processing load).

In various embodiments time warp daemon 509, 510 intercepts calls to time-dependent functions or methods from an application software 503-506 and then provides an expected response back to the specific application 503-506. Time warp daemon 509,510 emulates all time-based functions of an operating system kernel or low level library and independently determines a response time to include in its response, rather than using an actual operating system 507,508 system time or clock time.

For example, assume application Y 506 under normal circumstances sends a call to operating system 508 signaling that application Y 506 wants to "sleep" or "time out" for 300 milliseconds. Time warp daemon 510 however intercepts the call and sends a timer event back to application 506 just as soon as it is the next event in a queue maintained internally by time warp daemon 510. Typically this event would be sent only a few milliseconds after a "sleep for 300 milliseconds" (i.e., sleep(300)) request was sent, thus "warping" or "virtualizing" time.

In an embodiment time warp daemon 509, 510 maintains an internal queue of upcoming events and a "virtualized time" at which each is expected to occur. Each event is added to the internal queue pre-sorted so that the internal queue is ordered based on upcoming event times. For example, when inserting a new event, time warp daemon 509,510 uses one of a variety of well-established sorting algorithms to insert the new event into a queue of upcoming events in a position such that all events of lower index (that is, ordinal position in the queue) than the new event have earlier virtual times at which they will occur, and such that all events of higher index than the new event have later virtual times at which they will occur. There are numerous algorithms for such incremental sorting that are well-known in the art, any of which can be used for the purposes of maintaining an ordered upcoming event queue without departing from the scope of the invention.

According to an embodiment of the invention, when an event occurs (either because it was scheduled to occur—by being the next entry in the upcoming events queue—or when an event occurs asynchronously, which mechanism is discussed further below), the event is dispatched to the appropriate application by a time warp daemon 509, 510, and the event is "tagged" or identified with a virtual time essentially corresponding to the virtual time stored in the upcoming events queue (or included within an asynchronous event when it arrived). Because the only times sent to applications 503-506 are virtual times associated with those events, applications 503-506 are "unaware" that they are operating on virtual time rather than clock time. Unaware here means that the application has no means of determining any actual clock time, since all time-dependent functions and methods are intercepted by a time warp daemon 509, 510 and are handled using virtual time. Thus, importantly, applications 503-506 are able to run faster or slower than real time or clock time without having to make any adjustments in their internal operations. Because of this feature of time virtualization, off-the-shelf applications that depend on time (such as applications that use rates as internal variables) can be run at "fast speed" using virtual time without any necessity to recode the applications, or to reinterpret results afterward (this refers to an approach where one might run an off-the-shelf, time-dependent application faster than real time, then reinterpret the results by compensating for the inaccuracy of time after the fact, which can only be done when such inaccuracies are well-defined and isolable from other effects, which is rarely the case).

In another embodiment of the invention, rather than maintaining a queue of upcoming events, time warp daemon 509, 510 maintains a list of threads, storing for each sleeping thread a time at which the sleeping thread is scheduled to be woken (additionally, threads might be awoken by socket activity, as described herein). When all threads monitored by time warp daemon 509, 510 are sleeping, time warp daemon advances virtual time to the earliest of the scheduled wake up times associated with threads, and wakes up the thread associated with that earliest scheduled time to wake up. In some embodiments, a plurality of applications operate using virtual time, under supervision of a time warp daemon 509, 510, and in these embodiments all time-virtualized applications can share a common virtual time and interoperate without any of the applications' being aware that the common time being used is not, in fact, a system time or clock time.

In another embodiment of the invention, time virtualization is carried out directly by a computer's operating system, such that all time on the system is virtualized. In some embodiments, a binary tree is used for storing upcoming events or for storing thread information, rather than an ordered list. It should be understood that there are many ways to store this time information that are well-known in the art, some of which are more optimized for speed of execution (such as binary trees), and some of which are more optimal for easy coding and maintenance (such as ordered lists), and any of these may be used according to the invention.

Another benefit of running applications in virtualized time is that doing so provides another approach to optimally using information technology resources. Some applications are required to deal with computing loads that are highly variable; for example, contact center call routing engines experience computing intensities that are very highly dependent on arriving call volumes, and these call volumes in turn tend to vary from very low late at night to very high in mid-day periods, for typical contact centers. In previous times, such systems, typically servers, would be operated at much less than full capacity in order to allow such a system to surge when demand picked up without exceeding available resources. For several years, two main approaches have been used to address this problem. One is to distribute resources over multiple physical machines, for instance by using cluster architectures in which, for example, requests to a single internet protocol (IP) address are distributed across a cluster of servers which collectively act as a distributed computer. This approach has challenges with state and data management because state or data changes in one of the clustered servers may need to be propagated to others; an approach to mitigating this problem has been to rely on formally stateless application designs. A second approach to delivering optimal computing resource utilization for applications or systems in which demand varies widely is to use physical virtualization (which is distinct from time virtualization, which is the object of the present invention). Physical virtualization allows many virtual machines to be operated on a single large-scale, general-purpose computer, with each using only the resources it needs. In such systems, it is possible to place a high-priority application with a widely-varying demand profile on a virtual machine that is coresident (operates on the same physical machine as) a virtual machine that executes some less-demanding application (or one of lower priority), so that when the first application experiences a sudden increase in demand, it is able to pull resources away from the lower priority process in order to "expand" the virtual machine's resources for the first application. This approach is quite flexible and, when combined with the first approach (that is, when using the second approach on a clustered server which acts as a large distributed computer hosting multiple virtual machines), can handle demand swings of large magnitude while maintaining a high level of resource utilization.

In contrast to the methods of resource management known in the art and just described, time virtualization according to embodiments of the invention allow a far simpler approach to be used, when appropriate applications are involved. Appropriate applications are those, such as large-scale simulation but not limited to simulation, where resource demand varies greatly over real time, time-based computation is needed, but the application does not need a close tie between system time and real time. That is, time virtualization is an excellent approach to resource optimization when resource demands vary greatly over real time or clock time, but when there is no need to interact dynamically (in real time) with devices or other applications that are directly tied to an actual physical or clock time. For example, an application that analyzes data that has already been collected, and that experiences extreme variations in resource requirements based on the content of the data (for instance, when encountering a large table of data, and where requests to a separate application are made that depend in some way on table size, a sudden increase in CPU power may be needed, whereas for most smaller tables far less power is needed). In normal systems, if the main application or application to which requests are sent computes rates or performs other time-based computations (for example, if some computations or resource allocations depend on a computation rate computed in real time), then the situation is analogous to that experienced in large-scale simulations. Such applications can readily be performed in a resource-optimal way in time-virtualized systems, since the rate at which virtual time proceeds will naturally vary as demand varies, such that when demand is extremely high, virtual time may pass slower than clock time, while when demand is very light, virtual time may pass many times faster than real time. Since no clock time is "wasted" in time-virtualized machines (the machine will not need to wait for a timeout or another asynchronous event; it will automatically advance virtual time to the next event, thus maximally utilizing computing resources), with the exception of overhead caused by time virtualization (which generally is quite low), compute power will automatically be fully utilized in such systems.

Figure 6:
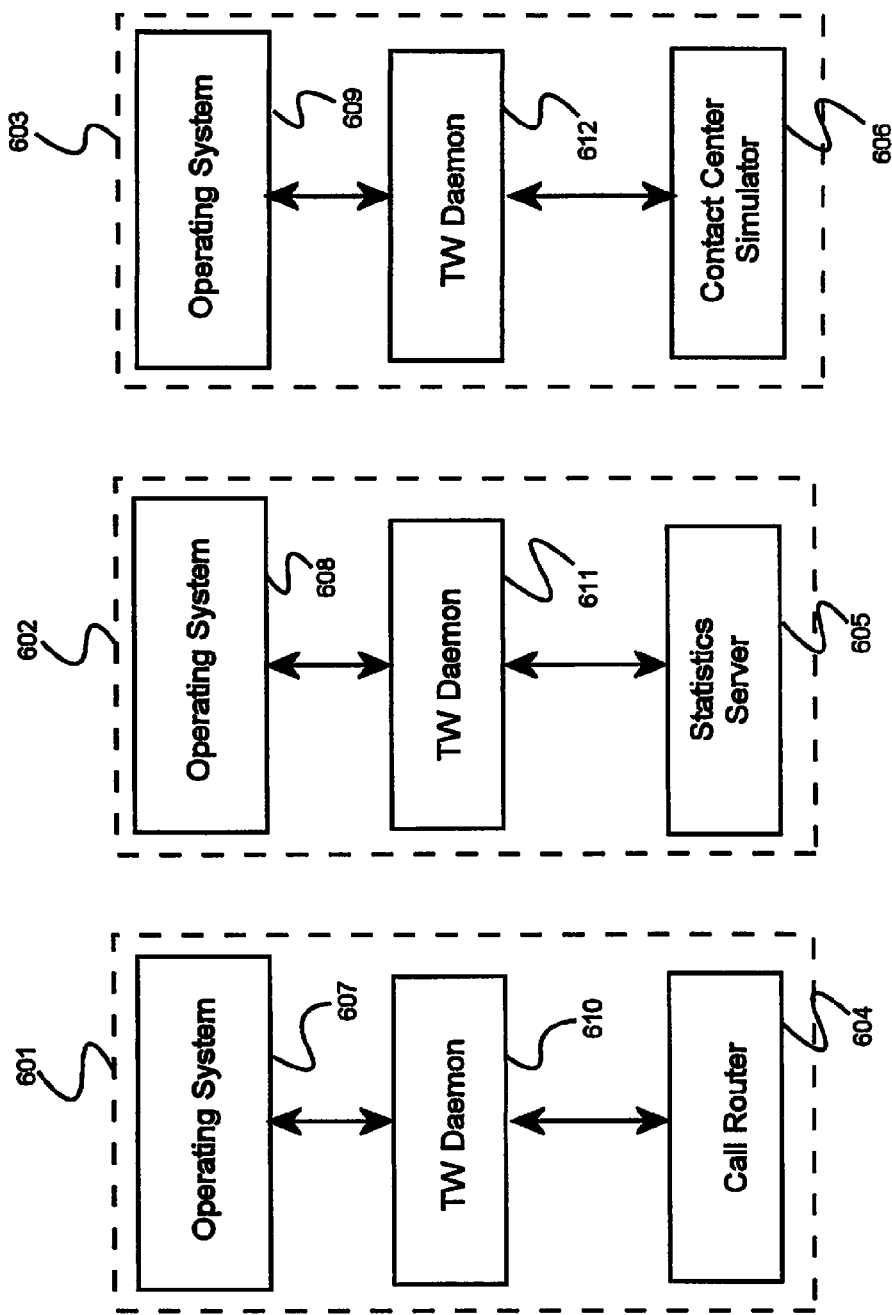
FIG. 6 is a block diagram of an embodiment of the invention illustrating specific applications.

FIG. 6 is a block diagram of an embodiment of the invention illustrating specific applications that may be used by a call center operator (the terms contact center and call center are treated herein as synonymous, and are not limited to centers that handle telephone calls only, but any centers that primarily handle customer interactions). Specific applications are a call router 604, a statistics server 605 and a contact center simulator 606. Each application may run on a separate server 601-603, as illustrated, or the applications may run all on one server, on several clustered servers each, or in any mix; the configuration shown is simply one example among many possible configurations, and should not be treated as limiting the scope of the invention. Call router 604, statistics server 605, and contact center simulation 606 are each adapted to communicate to the other two applications, typically via a packet-based data network such as a local area network (LAN) or a wide area network (WAN). In actual (non-simulated) contact centers, statistics server 605 receives events from systems such as automated call distribution (ACD) systems, for example events such as "call arrived", "call queued", "call established at an agent/customer service representative", "call released", and so forth, and from these events computes a plurality of statistics such as "average call duration", "average call wait time", "percentage of calls abandoned before reaching an agent", and so forth. In typical contact centers, call router 604 is a client of statistics server 605 and uses statistical information received from statistics server 605 to make call routing decisions (for example, "if average call waiting time exceeds 45 seconds, route this call to an overflow agent"). In a simulated contact center such as that show, contact center simulator 606 emulates telephony infrastructure and contact center agents, and is the source of events that are tracked by statistic server 605. Additionally, call router 604 receives route request events from contact simulator 606 and applies preprogrammed routing logic, using statistical information received from statistics server 605, to determine which agent (in this case of course, this means "simulated agent") should receive a particular call. Routing decisions are then passed to contact center simulator 606, which then simulates the events that would occur if an actual agent received an actual call, passing each of such events to statistics server 605 for continued computation of relevant statistics.

Each application 604-606 has time-dependent calls to operating systems 607-609 that are intercepted by a time warp daemon 610-612. As in the previous example, a time warp daemon 610-612 within each server 601-603 maintains an internal queue of upcoming events and a "virtualized time" at which each upcoming event is to occur. Each such queue is sorted so that the next event to occur in virtual time will always be on top of the queue or stack, ensuring that all time-based events occur in the right order with a correct "virtual time". After processing any incoming event, time warp daemon 610-612 fires a next expected event off its associated upcoming event queue or stack, and passes it to an appropriate application 604-606 immediately advancing the virtual time clock and collects any new event now processing it into the queue in the appropriate time sorted fashion. By maintaining a queue or stack of upcoming time based events and jumping form one event to the next, all idle time that occurs as applications wait for "real time" to catch up is eliminated.

Where applications 604-606 are not limited by central processing unit (CPU) power, there is a lot of idle time wasted; for instance, a CPU on machine 602 might be idle after updating all requested statistics on receiving an event from contact center simulator 606, until receiving a next event from contact center simulator 606. An embodiment of the invention utilizing time warp daemon 610-612 processes effectively eliminates such wasted time. The specific application (604,605,606) is "unaware" that time is compressed or warped so they behave normally. Time warp daemons 610-612 process allows simulated activities to run much faster by illuminating idle time. The invention allows simulations of large systems to be accomplished by creating this time-virtualized or time-compressed environment. For example, in a typical call routing scenario, routing operations can take place at as much as 200 times as fast as normal, physical, clock time. In other words, 200 seconds of "real time" are simulated in just one second, and this is achieved using off the shelf contact center application software 604,605 which never "realize" that time is being virtualized or compressed.

It should be noted that the arrangement shown in FIG. 3 adds some complexity to time virtualization, since virtual times maintained by time warp daemons 610-612 must be kept synchronized. This arrangement is merely exemplary, and other arrangements are possible, but before discussing them it is helpful to describe how such synchronization can be achieved according to the invention (there are several methods that occur to the inventor, and in fact many synchronization schemes are known in the art). In one approach, a plurality of time warp daemons 610-612 exchange, after each event is processed, a virtual time (expressed typically in universal computer time, that is, as a number of seconds after Jan. 1, 1970 or another reference data known to each of operating systems 607-609), representing the virtual time for each time warp daemon 610-612 at which the next upcoming event in that daemon's upcoming event queue is to occur. Since each time warp daemon 610-612 receives the same set of three "next event times" (one from itself and one from each of the other two), each of the time warp daemons 610-612 can perform a simple algorithm (such as, pick the lowest time, and in case of a tie, take the event from the tied events in a prearranged order based on its source machine) to determine when the next virtual time "stop" is to occur, and the daemon which "owns" this "next event" would immediately process that event. Such an approach is simple, but does add messaging overhead. Alternative approaches, such as maintaining a single upcoming event queue with a basic data locking mechanism to prevent conflicts, can be used. Alternatively, one master time warp daemon (for instance, in a preferred embodiment, one on the machine that runs contact center simulator 606), can be designated, and it can maintain a single upcoming event queue (and by extension, a single virtualized time dimension) that is used by applications 604-606, thus ensuring a synchronized virtual time that is shared by all the applications.

Figure 7:
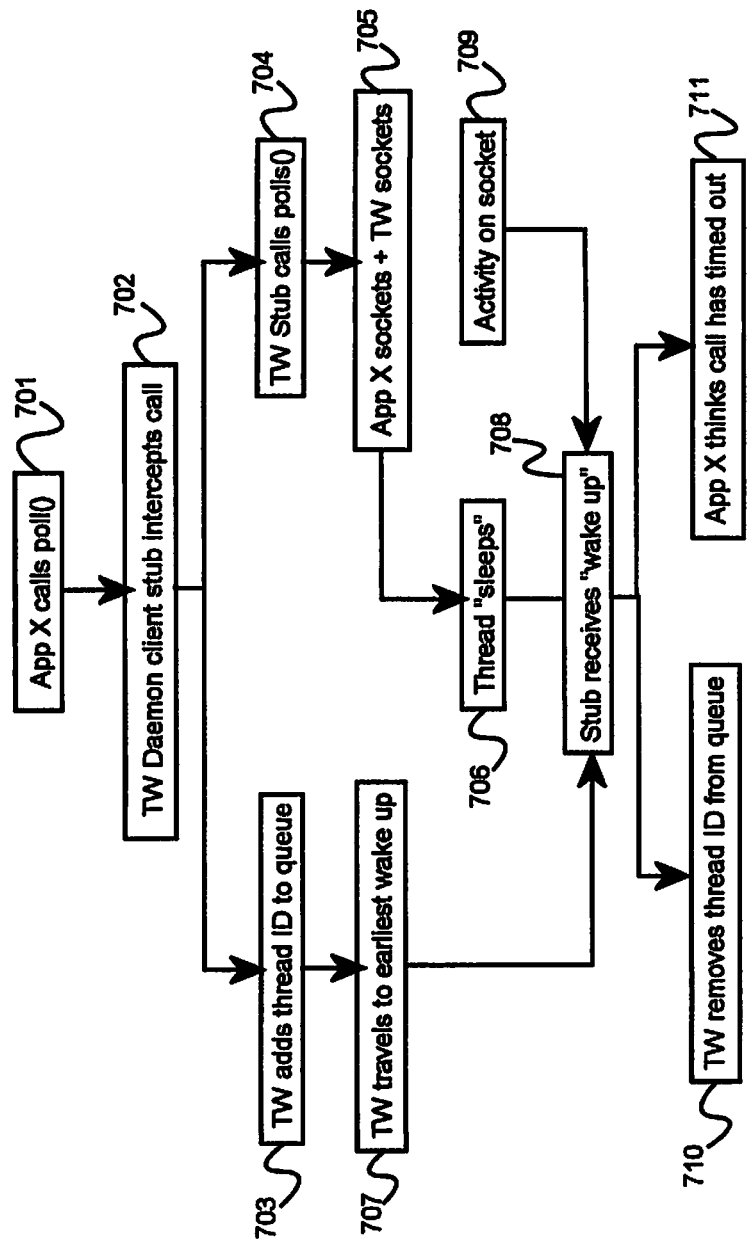
FIG. 7 is a process drawing showing the steps of the process for time virtualization.

FIG. 7 is a process drawing showing steps of a process for time virtualization according to a preferred embodiment of the invention. In the embodiment, a higher-level application such as a stat server calls poll( ) in step 701 to request a timeout on its network sockets. Normally this puts a process to sleep until the requested timeout is reached, or until other data comes into a network socket and wakes up the sleeping process or thread. According to the invention, however, a time warp daemon client stub intercepts this call in step 702 and sends a command to a time warp daemon that it requests a timeout for a certain period of time (or, it wants to sleep for a specified time unless interrupted by activity on a designated socket). A time warp daemon receives the message from the time warp daemon client stub and adds the specific thread identification to its queue of sleeping threads in step 703. In parallel, the time warp daemon stub also calls poll( ) without the timeout in step 704, but with the original sockets associated with application X's request (from step 701) included in the request to poll( ), while also including applicable time warp daemon sockets, in step 705. The original application's thread sleeps, in step 706, waiting for either network traffic from the sockets (provided via notification in step 709), or for a time warp daemon to travel to a next wakeup command in step 708 (which notification is itself in response to the time warp daemon's setting virtual time to the appropriate virtual time based on the first upcoming event in its upcoming event queue in step 707). Note that either an incoming activity on a socket (step 709) or a wakeup event (step 707) from a time warp daemon's upcoming event queue can cause a wakeup call to be received by time warp daemon client stub in step 708, thus allowing simulation to handle asynchronous events in a time warped environment. Also, in some embodiments, as described above, instead of an event queue, a list of threads is maintained, and only when all threads monitored are asleep (waiting for some external event such as a timer event or a socket activity event) will time warp daemon 509, 510 travel to earliest wakeup 707 and wake up the thread associated with the earliest scheduled wakeup time. In these embodiments, as long as at least one monitored thread is active, virtual time will either be maintained stationary or will proceed at the speed of real clock time (either approach may be used according to the invention); once any remaining active threads go to sleep to wait for future events, then step 707 is performed.

Time warp daemons each keep a list or queue of all threads and tracks if each thread is asleep and, if so, when each is scheduled to be awakened. Time warp daemons act immediately after receiving a command from a process. If all registered threads in a queue are sleeping, the time warp daemon essentially "time travels" to the earliest wake-up time (in step 707) of all its managed threads, and sends a message to that thread's socket telling it that it is time to wake up. When the stub receives the wake-up message (in step 708), the call to poll( ) is unblocked and the stub will make the application "think" that it has timed-out (in step 711).

In the scenario where all threads are busy (that is, not sleeping but actually doing something such as computing a statistic, a time warp daemon does nothing. Activity on a socket (in step 709) may wake up a thread independent of a time warp daemon. In this case a time warp daemon client stub then tells its specific time warp daemon that it is awake, and the time warp daemon removes the applicable thread ID from its queue of sleeping threads. This is a synchronous call, so that the time warp daemon client stub can determine its current virtual time and guarantee that no further "time travel" occurs after the response is received. Thus, if an application wakes up due to network activity before control is returned back to the application, a time warp daemon will have stopped time virtualization temporarily and cannot start again until all threads in the system are asleep. Thus a time warp daemon is able to handle asynchronous events while virtualizing time.

In some embodiments, applications don't work directly with events per se; rather, their threads are simply woken up or put to sleep. The events are sent to the time warp stubs, who are asleep waiting for an event from time warp daemon 509, 510 (as well as some application-defined file descriptors in case of some time-based functions such as poll( ) and select( ). As an optimization (to avoid extra context switching when clock_gettime( ) or related functions are called), the stubs (not the application) are told what time it is upon wakeup, but this is not necessary, as they could just ask time warp daemon 509, 510 for the time each time clock_gettime( ) is called.

Figure 8:
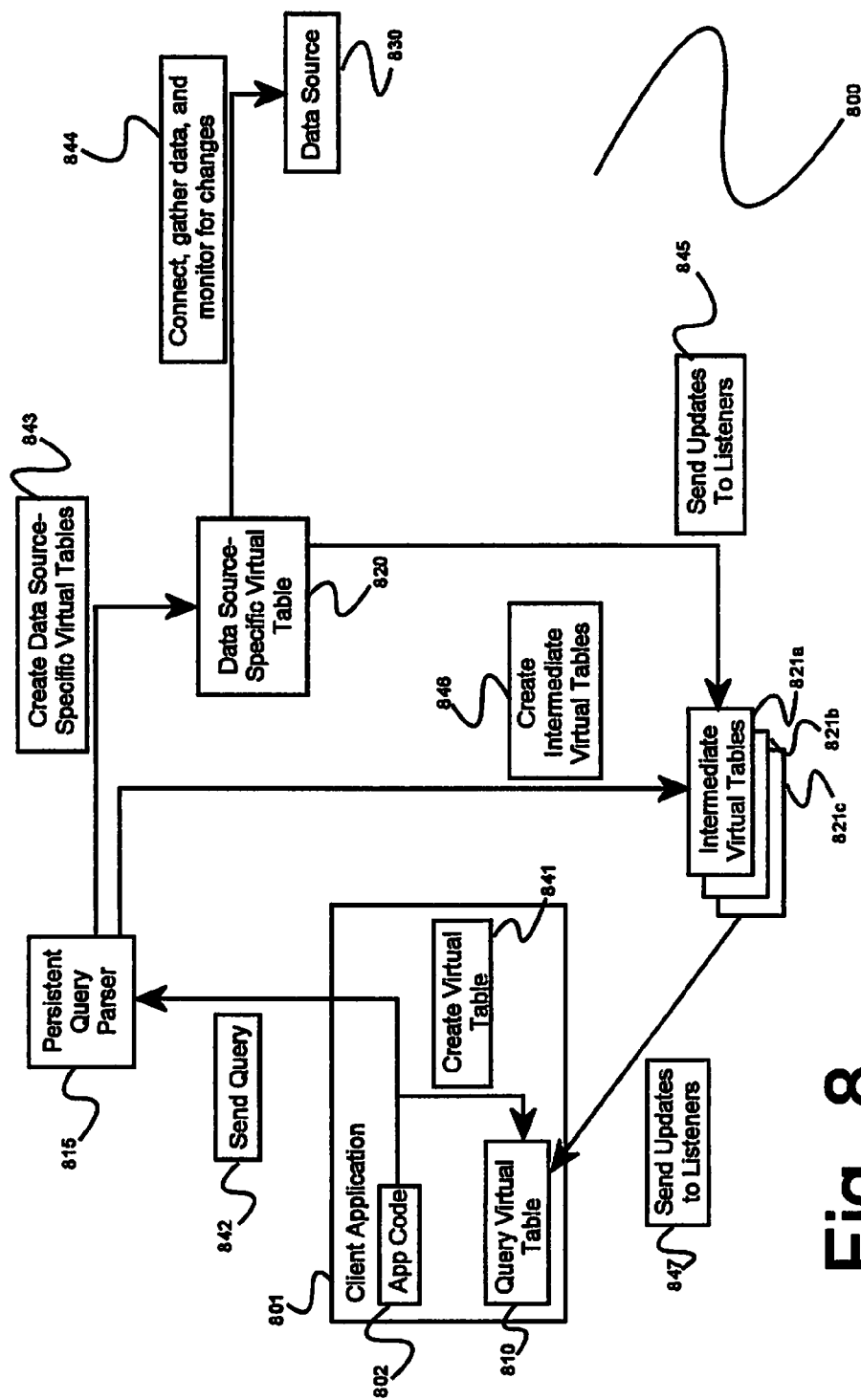
FIG. 8 is a block diagram of a conceptual architecture of a real-time database system supporting persistent queries, and methods for using same according to a preferred embodiment of the invention.

FIG. 8 is a block diagram of a conceptual architecture of a system 800 according to a preferred embodiment of the invention. According to the embodiment, client application 801 is a software application running on a computer that makes use of one or more persistent query services in order to access a plurality of data sources 830, which may be comprised of one or more relational database systems, a set of data stored in memory of a computer, a flat file data store such as a file comprising transaction records, a server software running on a computer and adapted to provide notifications of various types to requesting clients (for example, a computer-telephony integration or CTI server, or a configuration server, each of which—and other server systems—provides a standards-based or proprietary application programming interface or API that allows other applications to receive data from the server software), or any other software or hardware system accessible to client application 801 on the same computing device or across a network. Client application 801 functions by receiving a query, via application code 802, that describes a desired set of data from one or more data sources 830 for the purposes of data analysis, reporting or another function. A query may include for example data insert, query, update and delete, schema creation and modification, data access control, and other data-centric operations typical of database query languages such as Structure Query Language (SQL). Queries include a list of one or more columns representing the desired data to be included in a final result. A query may also include operators and functions for calculating values on stored values, or on values passing through a virtual table as they are received from an underlying data source, and queries typically allow the use of expressions (for example, expressions that may produce either scalar values or tables consisting of columns and rows of data). In some embodiments, queries may be nested so that the results of one query may be used as a data source in the containing query via a relational operator or an aggregation function. A nested query is also known as a subquery. Once a query (herein, referred to as an "active query") is received by application code 802, a process of creating a virtual query table (herein, referred to as 'query table') representing the output of the query is commenced by invocation of a create virtual table function or operation 841. In order to populate a newly-created virtual table corresponding to the query, the query is sent to persistent query parser 815 by send query function or operation 842 to persistent query parser 815. Persistent query parser 815 may in some embodiments be an integral part of, or may be connected by a network to, client application 801. It will be appreciated by one having ordinary skills in the art that there are various network protocols that may be used to allow software processes to communicate with each other. Persistent query parser 815 parses the active query by first finding delimiters in the query. Based on the position of the delimiters, persistent query parser 815 extracts various substrings of the elements delineated by the delimiters, creating a structured logical expression that encompasses the complete logical content of the original query in a form suitable for use by database systems (this is analogous to how relational database systems known in the art parse a received SQL query), and compiles the directives to determine a resultant set of data and relationships between various data sources that the active query is requesting. For example, a query "SELECT name, address FROM CustomerData WHERE agent='smith'" submitted to application code 802 would result in the creation of a virtual table with columns 'name' and 'address'. The rows of the persistent query table are the resulting data, based on the query directives. In this example, the resultant data would be customer name and address that were handled by an agent named 'smith'. Persistent query parser 815 then creates a virtual table tree representing, for example, the relationships, associations, data sources, etc. of the desired data as per the active persistent query. Persistent query parser 815 then creates one or more intermediate virtual tables 821 in the form of a virtual table tree, as well as one or more low level data source-specific virtual tables 820 as the nodes of the table tree that gather data from one or more data sources 830 (for example, a configuration service database, a flat file on a file system, a log file from a server, transaction information from a communication server, resource information from a relational database management system, or other data source). The persistent query virtual table and the intermediate virtual tables are created in a tree like structure with the nodes being one or more data source-specific virtual tables 820. In a preferred embodiment, intermediate virtual tables 821a may connect to one or more data source-specific virtual table 820 each connecting, gathering and monitoring for data changes 844 that occur in data source 830. For example data source-specific virtual table 820 may gather employee data from a human resource database data source 830. The data that is monitored is specific to the data requested in the active persistent query submitted to application code 802 (that is, the resultant data that is expected in the persistent query table) and only specific data required by intermediate virtual tables 821 and/or the query table is processed while other data is ignored. By gathering and monitoring the data that is needed the invention benefits from a considerable increase in performance as the amount of data that is needed for a persistent query is generally much less in quantity than all the data that is collected by RDBMS systems in typical systems known in the art. In addition to data fields created by persistent query parser 815 for each virtual table, persistent query parser 815 also creates one or more methods to perform actions on the data, data sources, or some other object and to trigger notifications to parent tables. For example, a data source-specific virtual table 820 creates a listener for the data source. Based on the characteristics of the active query, the listener gathers and monitors only data necessary to satisfy the active query (for example, the items in the SQL "WHERE clause"). For example, "SELECT name, address FROM CustomerData WHERE AgentID='1234'", a data source-specific virtual table 821a connected to a table, for example "CustomerData" in data source 830. Data that would be passed up the virtual tree would be records having a field "AgentID" with a value of '1234'. Persistent query parser 815 would then set up all additional listeners to each virtual table so that when a data change happens in data source 830, only affected elements propagate up the tree (by sequential calls to listeners of interim virtual tables) until they get to the original active persistent query on client application 801, at which point any updates are passed to the client. In a preferred embodiment, a persistent query system 800 may include, but not limited to, SQL operators in Table 1.

TABLE 1

Example operators and their functions

| Operators | Function |
|---|---|
| SELECT | selects data from one or more database tables and/or views |
| INSERT INTO | facilitates the process of inserting data into a table |
| WHERE | works in conjunction with other SQL clauses like SELECT, INSERT and UPDATE to specify a search condition for these statements. |
| DISTINCT | works in conjunction with the SQL SELECT clause and selects only distinct (unique) data from a database table(s) |
| UPDATE | serves to update data in database table |
| DELETE | used to delete data from a database table |
| TRUNCATE TABLE | deletes all rows from a database table |
| ORDER BY | defines in what order to return a data set retrieved with a SQL SELECT statement. |
| Aggregate function such as SUM, AVG, MIN, etc. | used to sum, count, get the average, get the minimum and get the maximum values from a column or from a sub-set of column values |
| GROUP BY | used along with the SQL aggregate functions and specifies the groups where selected rows are placed |
| HAVING | provides a search condition for a group or aggregate |
| AND and OR | used together with the SQL WHERE clause to join two or more search conditions specified in the WHERE clause |
| JOIN | selects data from two or more tables tied together by matching table columns |
| UNION | merges the results of two or more SELECT SQL queries into one result set |

In another embodiment, a proprietary or open source query language may be used for managing data, linking, aggregation, projections, filters, macros, compositional syntax, establishing data types and functions, and creating persistent queries in a persistent query system 800.

DETAILED DESCRIPTION OF EXEMPLARY EMBODIMENTS

Figure 9:
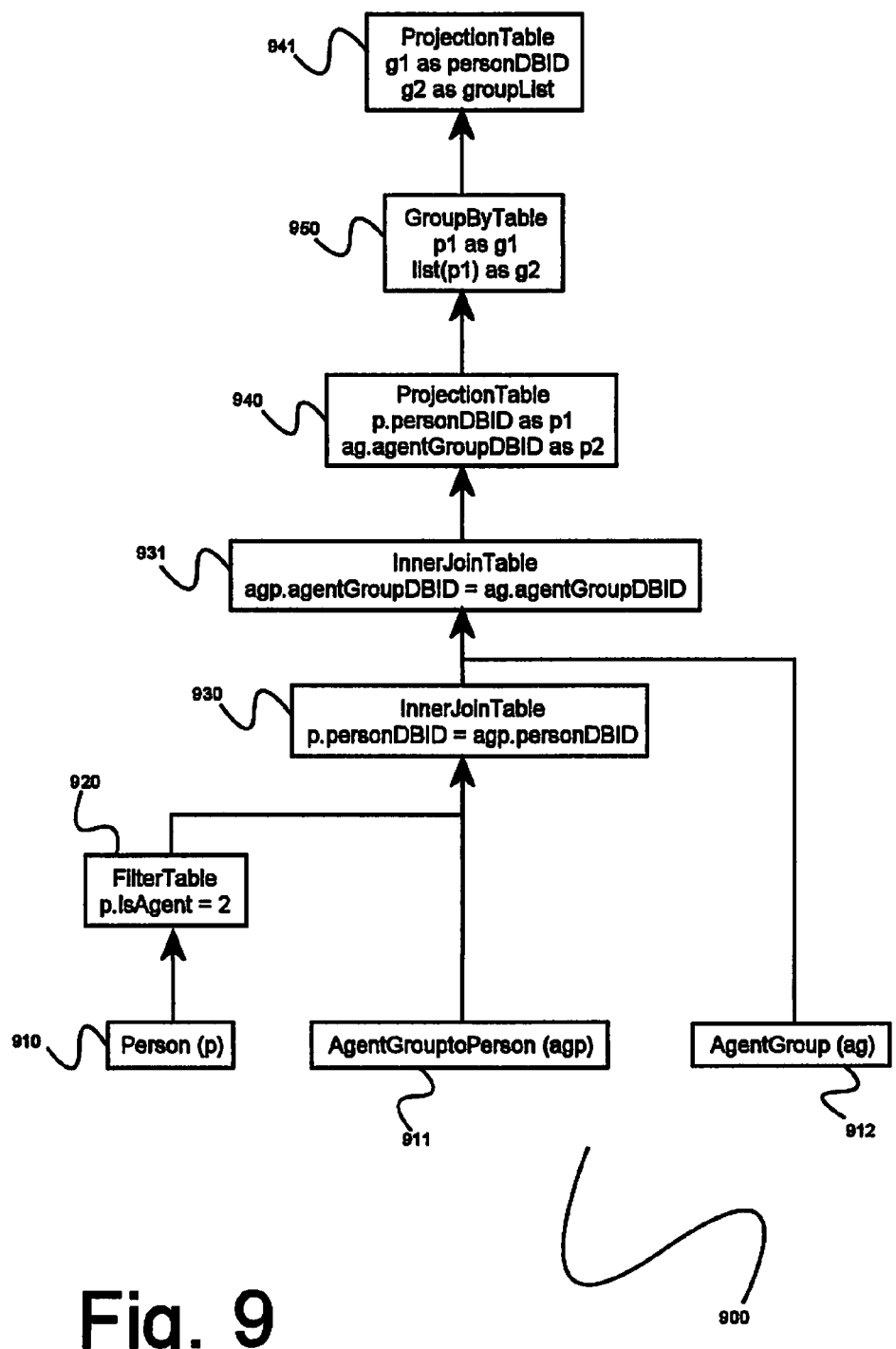
FIG. 9 is a diagram illustrating relationships between virtual tables for a first exemplary query, according to a preferred embodiment of the invention.

FIG. 9 is a diagram illustrating relationships between virtual tables for a first exemplary persistent query, according to a preferred embodiment of the invention. While exemplary query 900 is based on a common contact center-related use case, it should be understood that query 900 (and, for that matter, query 1000 described below) are merely exemplary, and that queries created and used according to the present invention could be from any subject domain without departing from the scope of the invention. Exemplary query 900 is a virtual tree diagram outlining a query virtual table 841, a set of intermediate tables 821, and a set of data source specific virtual tables 820 for a sample query (herein, referred to as "sample query") that produces a table with one row per agent. Each row in the table set will have a person DBID of an agent and a list of agent group names of which the agent is a member, in a customer service communication environment. That is, a query that may be expressed in SQL as "SELECT p.personDbid AS personDbid, list(ag.agentGroupName) AS group List FROM Person p INNER JOIN AgentGroupToPerson agp ON p.personDbid=agp.personDbid INNER JOIN AgentGroup ag ON agp.agentGroupDbid=ag.agentGroupDbid WHERE p.is Agent=2 GROUP BY p.personDbid". Person table 910 is a data source-specific virtual table 820 that stores data, consumes memory, and has one or more records of persons within, for example, a customer service organization. For example, person virtual table 910 holds one thousand records of the names of the employees employed by the customer service communication center organization with details on their job function. The virtual table has an alias of "p" and may be referenced by this letter for query purposes. Agent group table 912 is another data source-specific virtual table 820 that stores data and consumes memory that has one or more records of agent groups within a customer service organization. For example, agent group virtual table 912 holds fifty records of the names of the agent groups based on group function (for example, billing group). Agent group to person table 911 is another data source-specific virtual table 820 that stores data, consumes memory, and has a one or more records of a list of persons and the agent groups to which each person belongs. For example, five hundred records of agents and the agent group ID to which they belong. Filter table 920 is a virtual table that manipulates data from person table 910 by applying a filter to the data to inner join table 930. For example, filter table 920 only requires the records from person virtual table 910 where field IsAgent=2 (that is, all records of persons who are agents). Of course, it would be understood by one having ordinary skill in the art that any logical expression may be used to filter data (for example, in a tax related table there may be a filter where a field t.SSN starts with 215). Inner join table 930 manipulates data when there is a match between filtered results of person table 920 (that is, where the person is an agent) and agent group person table 911 and combines the data together. For example, when the DBID of the person from the filtered results from person table 910 are compared to the person DBIDs of agent group to person table 911, a virtual table of agents and each agent group to which they belong is created. Inner join table 931 manipulates data when there is a match between data from inner join table 930 and agent group table 912. For example, a table is created with persons and a name of the agent groups to which they belong, when agent group DBID record from the table created by inner join table 930 matches group DBID from agent group table 912. Projection table 940 is a table that stores data, consumes memory, and creates an alias for required data, based on the sample query. For example, personDBID from person table 910 may be referenced as p1 and agent group name from agent group table 912 may be referenced as p2 for the purpose of, for example, convenience. Group by table 950 aggregates (that is, consolidates and calculates) column values from projection table 940 into a single record value. For example, one row per agent with each row in the result having the person DBID and a list of agent group names that agent is a member of. Projection table 941 is a table that stores data, consumes memory, and creates an alias for required data, based on the sample query. For example, g1 from group by table 950 may be referenced as personDbid and a list of agent group names referred to as g2 may be referred to as groupList for the purpose of, for example, labeling and readability.

Figure 10:
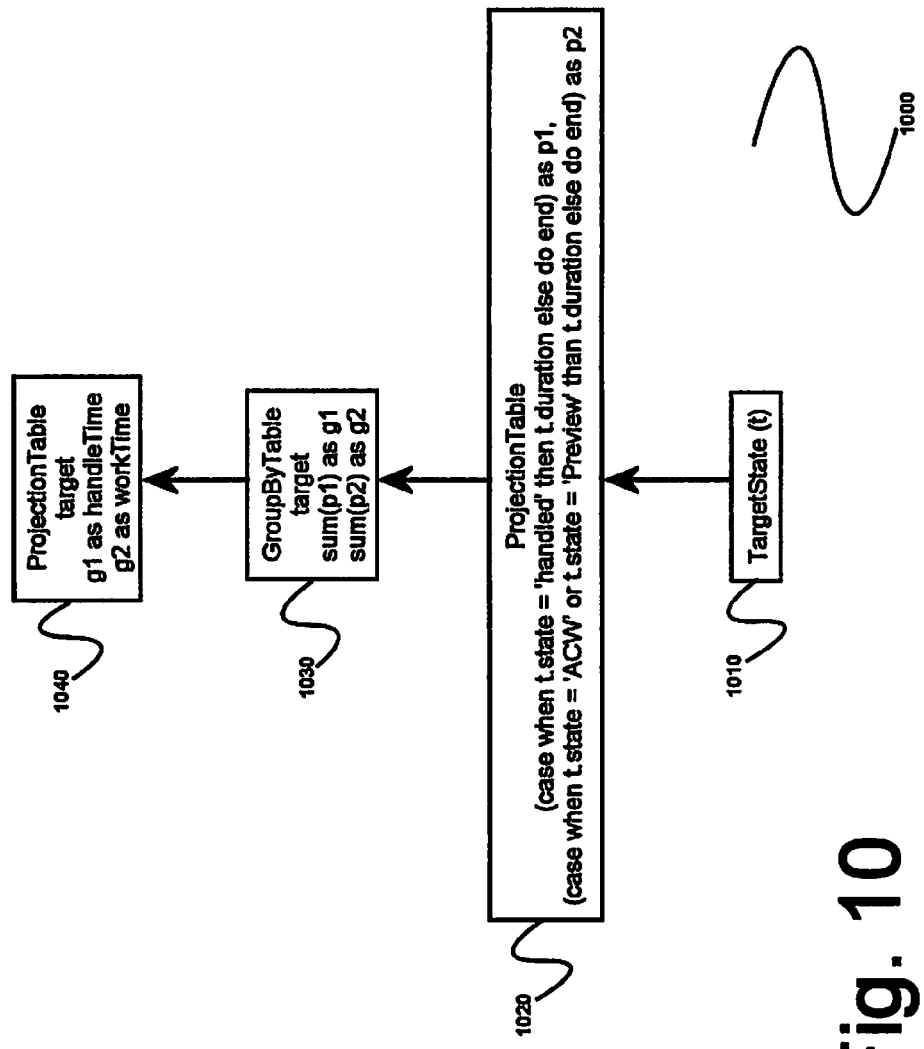
FIG. 10 is a diagram illustrating relationships between virtual tables for a second exemplary query, according to a preferred embodiment of the invention.

FIG. 10 is a diagram illustrating relationships between virtual tables for a second exemplary persistent query, according to a preferred embodiment of the invention. Exemplary query 1000 (again, query 1000 is intended as an example of a persistent query according to the invention, but it should be understood that the invention is in no way limited to queries having to do with contact centers or any other subject domain) is a virtual tree diagram outlining a query virtual table 841, a set of intermediate tables 821, and a data source specific virtual table 820 for a sample query (herein, referred to as "sample query") that produces a table of a basic workforce management (WFM) report with handle time (time spent on a call) and work time (time spent in after call work (ACW) or previewing an outbound call) for agents in a customer service communication center environment. That is, a query that may be expressed in SQL as "SELECT t.target AS target, SUM(CASE WHEN t.state='Handled' THEN t.duration ELSE 0 END) AS handleTime, SUM(CASE WHEN t.state='ACW' OR t.state='Preview' THEN t.duration ELSE 0 END) AS workTime FROM TargetState t GROUP BY t.target". Target state table 1010 is an infinite virtual table that generates rows but does not store them from data source 830 (for example, a transactional event log from a communications server). Target state table 1010 may generate a row each time a notification is received when a transactional event occurs in data source 830. The infinite nature of the table is due to the continuous creation of data rows while the sample query is active. Projection table 1020 is a virtual table that manipulates data from target state table 1010. In this example, if field "state" in target state table 1010 has a value of 'Handled', the value of data field "duration" is stored in p1 otherwise if field "state" in target state table 1010 has a value of 'ACW' or 'Preview', the value of data field "duration" is stored in p2. In this example, a value of 'Handled' refers to a transaction that was handled by an agent and 'duration' holds an amount of time that said agent spent handling the transaction. A value 'ACW' refers to a transaction that relates to after call work for an agent with duration equal to the value in the data field 'duration'. A value of 'Preview' refers to an agent that spent time previewing information for an outbound call. The time said agent spent on previewing the outbound call is that value stored in the field 'duration'. Group by table 1030 aggregates column values from projection table 1020 into a single record value. For example, for each agent total handle time is calculated by summing p1 values from projection table 1020 and calculating total work time by summing p2 values from projection table 1020. Projection table 1040 is a table that stores data, consumes memory, and creates an alias for the sample query. For example, g1 from group by table 1030 may be referenced as handleTime representing the handle time for the agent. Additionally, g2 may be referenced as workTime representing the total work time for agents in target state table 1010 for the purpose of, for example, labeling and readability. Example persistent query 1000 continues to produce data in the query table as long as the sample query remains active. This is an improvement over systems known in the art in that only the data that is needed is filtered and passed up the virtual table tree to produce the required table of results. This makes it feasible when processing large data sets particularly in real-time systems to provide highly-responsive performance even when frequent incremental changes are made to one or more underlying data sources. In particular, the invention makes it unnecessary for a query to be executed fully to refresh a result set each time a change occurs in an underlying data source, as is commonly done in the art today; rather than executing a complex query that may comprise numerous logical operations, data aggregations, and computations each time underlying data changes occur, according to the invention it is only necessary to update those elements of a persistent query that are affected by any specific changes to underlying data sources, while leaving all other elements in a result set unchanged.

Figure 11:
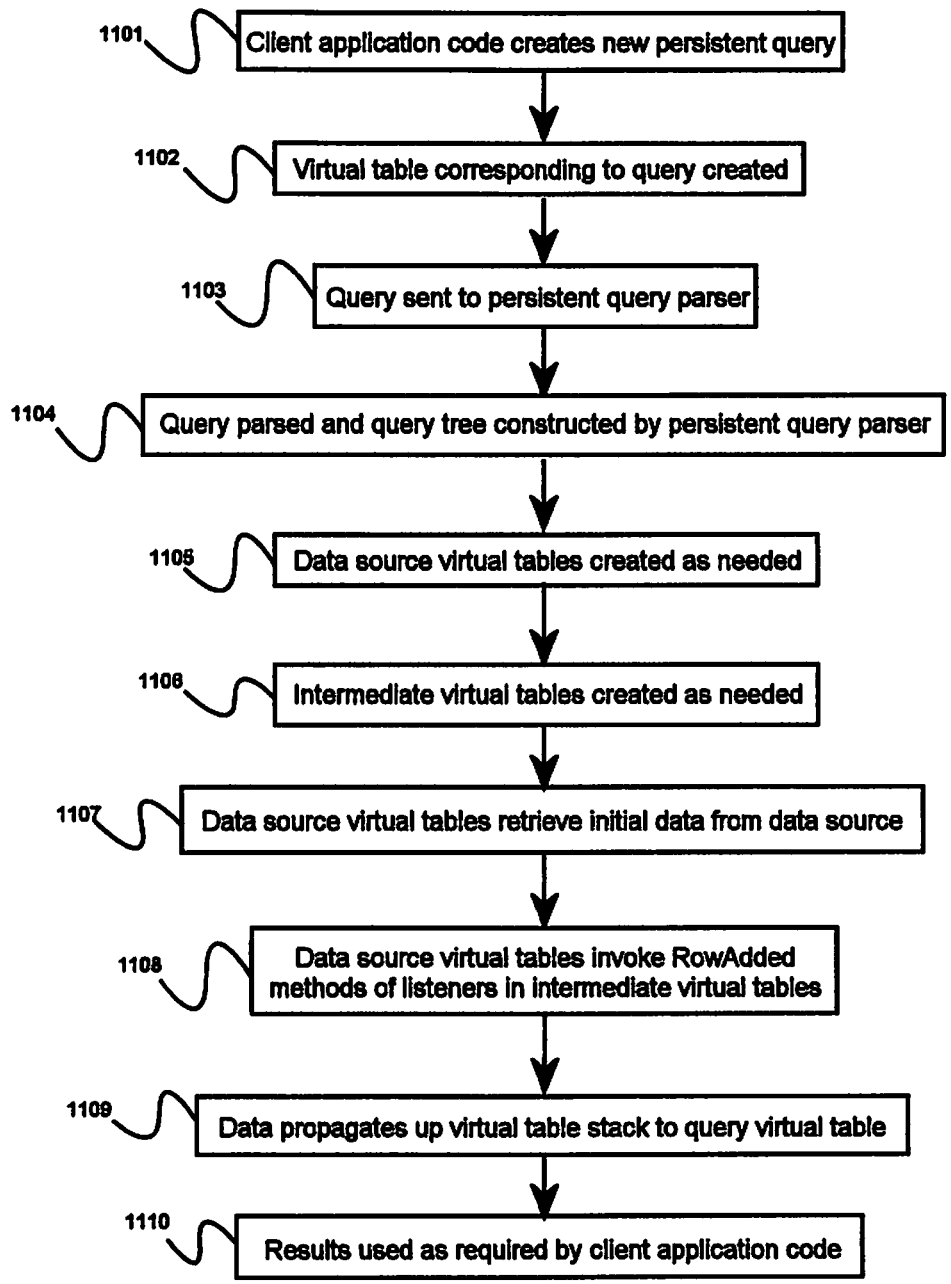
FIG. 11 is a process flow diagram illustrating a method for setting up a dynamic real-time data query, according to a preferred embodiment of the invention.

FIG. 11 is a process flow diagram illustrating a method for setting up a dynamic persistent real-time data query, according to a preferred embodiment of the invention. In step 1101, client application 801 creates a new query. In step 1102, create virtual table 841 creates a virtual table with a structure that represents the desired data (for example, a set of columns for each data element that is desired); at this point, no data exists in the created virtual table. The query is submitted via application code 802 to LiveSQ parser 815 in step 1103. The query is parsed and a tree structure representing the intermediate virtual tables that are required for the query is created. Persistent query parser 815 identifies which data sources are required for the query and a data source specific virtual table 820 is created for each data source (for example, a RDBMS, a configuration service database, a transactional log file, a flat file, or some other repository of data) in step 1105. Data source specific virtual tables are responsible for monitoring one or more data source 830 to identify when new data is available that may be needed from the query in step 1101. In step 1106, persistent query parser 815 creates the intermediate tables required to combine, process and move data up the tree to the persistent query virtual table created in step 1102. In some embodiments, virtual tables may generate output the console when an event occurs (for example, when a new row appears). In another embodiment, an optimization process may decide to change the table structure dynamically to an equivalent but faster version. While client application 801 maintains the persistent query in step 1101 active, the query virtual table 841, intermediate virtual tables 821, and data specific virtual tables 820 stay active and monitor the child tables and/or data sources accordingly. In step 1107, data source specific virtual table 820 receives initial data from data source 830. The data that data source specific virtual table 820 receives is specific to what is required for the persistent query from step 1101. In step 1108, data source specific virtual table 820 invokes one or more methods to perform actions on the data, data sources, or some other object (for example, a listener method to identify when a row has been added to an intermediate virtual table 821, a data source specific virtual table 820, and/or to a data source 830, a listener object). In some embodiments, intermediate virtual table 821a may change an incoming row-added into a row-changed or some other notification. In another embodiment, intermediate virtual table 821b may also hide incoming notifications. In another embodiment, intermediate virtual table 821*c* will let the notification pass through but may change the data (for example, the query in step 1101 may require data to be combined with other data sources or calculated as an average, or some other change that is required). In step 1109, the data propagates up the virtual tree structure and is added to intermediate virtual table 821*a* as necessary. In some embodiments, an intermediate virtual table 821, data source specific virtual table 820, or other virtual table in the virtual table tree structure may only receive events and not store data. In another embodiments, an intermediate virtual table 821, data source specific virtual table 820, or other virtual table in the virtual table tree structure, data may pass through and apply joins (for example, to query data from two or more data specific virtual table 820, intermediate virtual tables 821, or other virtual tables in the tree structure based on a relationship between certain columns in these tables). In another embodiment, an intermediate virtual table 821, data source specific virtual table 820, or other virtual table in the virtual table tree structure, data may be kept in memory for future processing by other methods or to be used by intermediate virtual tables 821, or for some other purpose. In step 1109, results propagate up to persistent query virtual table 841 created in step 1102 representing the query from step 1101. In step 710, client application 801 may use the resulting data for aggregation or calculations. While the query from step 1101 remains active, persistent query virtual table 841 created in step 1102 will continue to be updated as new data arrives in data source specific virtual table 820 and or/intermediate virtual tables 821.

In some embodiments of the invention, frequently reused virtual tables may be maintained even when all current persistent queries that use them have been deleted by the applications that created them, in order to further improve system performance. In such embodiments, when a new persistent query is created by an application, any virtual tables required that have been maintained can be immediately used without running any queries against underlying data sources (since the still-maintained virtual tables will be populated by data that reflects that latest changes to any underlying data sources), thus enabling rapid creation and execution of new persistent queries.

Figure 12:
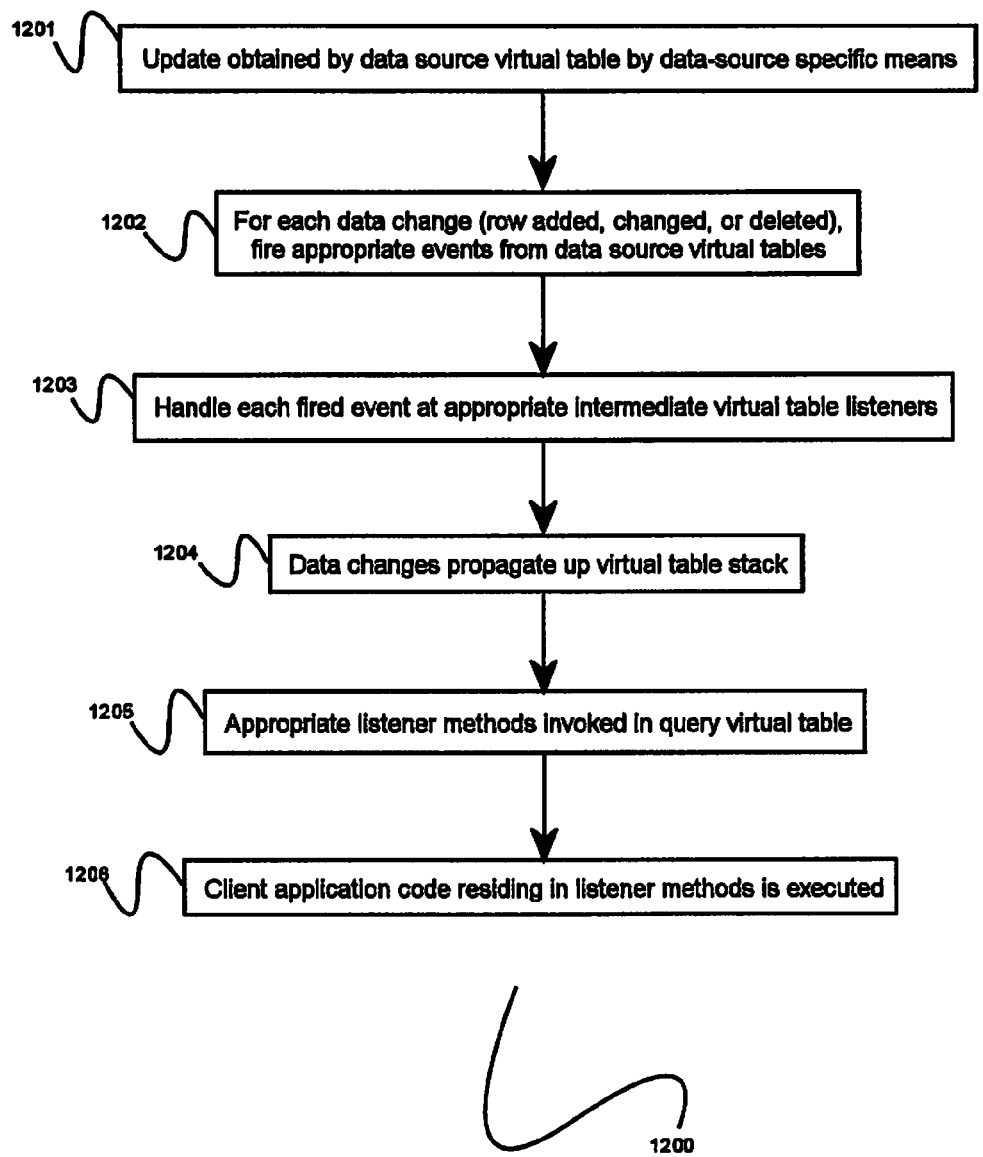
FIG. 12 is a process flow diagram illustrating a method for handling changes in source data within a dynamic real-time data query, according to a preferred embodiment of the invention.

FIG. 12 is a process flow diagram illustrating a method for handling changes in source data within a persistent real-time data query, according to a preferred embodiment of the invention. In step 1201, data source specific virtual table 820 receives a notification that there is an event with respect to data data in data source 830. In this example, data events will be accepted or ignored based on the requirements of a persistent query submitted via client application 801 (herein, referred to as an "active query" or a "persistent query"). For example, one or more rows have been added, and/or one or more rows have changed, and/or one or more rows have been deleted or a combination of these. Event notifications from data source 830 may depend on the specific data source, for example, a data source 830 that is a configuration service, or another type of data source may provide notification when changes occur. A data source 830 that is a telephony server or another type data source may require that data source-specific virtual table 820 register for object notification within data source 830 so that it may listen to for changes. In another embodiment, data source 830 may be an RDBMS database (for example, postgres, or another data base management system known in the art) that provides notification triggers to notify data source-specific virtual table 820 with notifications that data may have changed (for example, row added, changed, or deleted). For a data source 830 that does not support notification triggers (for example, a low functionality database, a flat file, or spreadsheet), data source-specific virtual table 820, or a manual configuration, may invoke a method to use an internal database trigger or file function to write to a log whenever changes (for example row added, changed, or deleted) occur. The log may be periodically checked by data source-specific virtual table 820 to retrieve necessary data for the active query. In step 1202, when a data change that is required for the active query, data source-specific virtual table 820 notifies the parent intermediate virtual table 821*c* that data has changed (for example, a row has been added). In step 1203, as data propagate up the virtual table tree creates by persistent query parser 815, parent virtual table intermediate virtual table 821*b* may use the data (for example to join to another set of data from a different source for aggregation, to calculate averages or some other value using the data, etc.). In step 1204, intermediate virtual table 821*b* then notifies the parent intermediate virtual table 821*c* that data has changed by firing the appropriate event and so on to propagate the change up the virtual table stack until in step 1205, the query virtual table 841 listener methods are invoked and query virtual table 841 is updated with data that represents the output of the query. In step 1206, client application code residing in listener is executed and data is available to client application 801.

Figure 13:
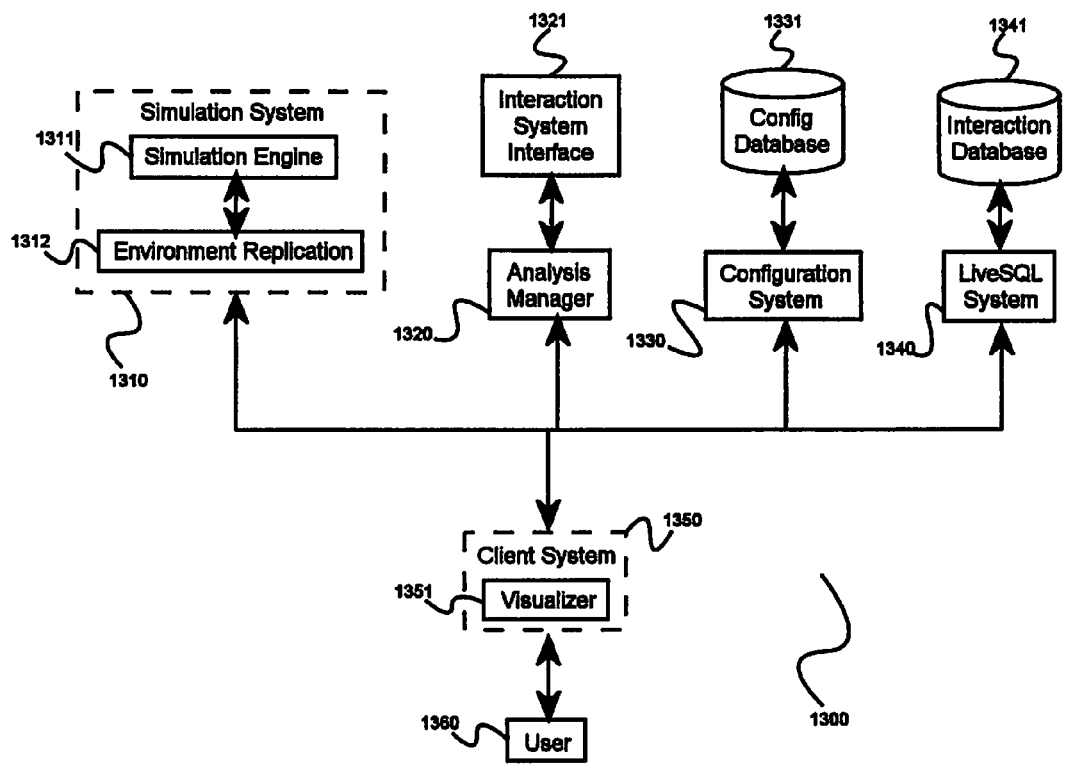
FIG. 13 is a block diagram of a conceptual architecture of a system for analyzing and manipulating interaction data, according to a preferred embodiment of the invention.

FIG. 13 is a block diagram of a conceptual architecture of a system 1300 for monitoring and control of contact centers that uses a dynamic temporal dimension, according to a preferred embodiment of the invention. According to the embodiment, client system 1350 consists of a graphical user interface 1351 (herein, referred to as visualizer 1351) that depicts a visual interpretation of communication objects (for example, a telephone, VoIP endpoint, email inbox, and the like), interaction information (for example, incoming telephone calls, outbound telephone calls, email interactions, social media interaction, such as Twitter™, Facebook™, task information from a CRM system, etc.), and events (for example, a notification of a configuration change, a transition in an object's state, a communication event or some other event generated by system 1300. LiveSQL system 1340 receives interaction information from one or more interaction databases 1341 (it would be understood by one having ordinary skill in the art that a database may reside in memory such as random access memory and/or secondary storage such as a hard disk drive, a solid-state drive or some other medium to temporarily or permanently hold data and sequences of instructions. Furthermore a database may be a virtual database where tables are dynamically created, modified, or deleted as needed) as described by FIG. 8. Interaction information (for example, communications between two humans or processes whether synchronous or asynchronous, and the like), event information (for example, a new communication request, system configuration change such as a change in the skills of an agent, etc.) and other information in system 1300 may be captured by LiveSQL system 1340, passed to client system 1350 and depicted in a visual fashion by visualizer 1351 to user 1360. Visualizer 1351 provides GUI 1700, a graphical user interface that is displayable on user 1360 device such as a computer monitor, mobile device, a tablet device, etc. to user 1360. Once interaction and event information is displayed as described in FIG. 17, user 1360 may analyze the data, perform simulations, and perform experimentation. For example, in a communication center environment, user 1360 may access analysis manager 1320 to analyze call volumes, call arrival traffic patterns, specific agent behavior, etc. visually to understand the dynamics of interaction behavior in system 1300. For example, if a customer service contact center business analyst wished to verify the right agent service level (that is, the service level for a customer to reach the right agent—i.e. an agent that is equipped to handle a query from said customer), analytics manager may be accessed by Visualizer 1351 to determine call answer and call transfer behavior by agents represented in system 1300. In another embodiment, a business analyst analyzing call answer behavior may query analysis manager 1320 via visualizer 1351 to analyze work avoidance agent behavior. For example, some agents may answer a call, immediately ask the caller to hold, and return to the call at a later time or not return to the call at all. In some systems known in the art, this behavior would adversely affect service level calculations. Visualizer 1351 may visually display this behavior in a visually coded manner that is a considerable improvement over systems known in the art.

In a particular embodiment, system 1300 includes simulation system 1310, which is preferably a scalable simulation service accessible via a network, which may perform simulations of a plurality of interactions and events in an interaction-processing environment. For example, simulation engine 1311 may collect interaction information (for example, the number of interactions in a given period, the average length of time an interaction is in the system, etc.), communication object behavior (for example, in a communication environment, skills associated to agents commanding a communication object, the number of agents based on a predefined schedule, etc.) and interaction movement information (for example, interaction routing behavior from an interaction routing system such as an intelligent routing system, an ACD queue, a hunt group, and the like known in the art). In another embodiment, forecasted or computed information on interaction behavior may be used as well. Once simulation engine 1311 collects necessary information, environment replication 1312 creates a schema to define how simulated interaction traffic may behave when simulated interactions are run through the system by simulation engine 1311. A simulation may take many forms, for example, a simulation may be intended to mimic the behavior of an interaction system for the purpose of predicting future issues. In a particular embodiment, a simulation may be used to experiment on "what-if" scenarios in, for example, an attempt to make interaction systems more efficient, or to determine the root cause of an issue. For example, in a communication center environment, a problem may have been reported by a customer that a particular system was unresponsive. In this example, a support analyst user 1360 may access visualizer 1351 with data loaded from LiveSQL system 1340. User 1360 scrolls back (that is configure visualizer 1351 to focus on the time interval when the problem occurred) to visually inspect the state of communication objects and the behavior of interactions in an attempt to remedy the issue.

In a particular embodiment, simulation engine 1311 collects a small amount of high-level data (for example, average handle times, service level, average speed of answer, and the like) as opposed to detailed event-by event data to generate a coarse environment replication. In this embodiment, a much faster, but potentially, a less accurate simulation would result.

Referring again to FIG. 13, as analysis manager 1320 collects analyses and actions performed by user 1350 and circumstances surrounding the actions. Once analysis manager 1320 detects repeated behavior or specific patterns emerge, analysis manager 1320 stores the action by user 1350 in configuration DB 1331 via configuration system 1330. In this example, analysis manager 1320 may automatically perform corrections to the interaction system (for example, a contact center, a CRM system such as Siebel™, Salesforce.com™ or the like) via interaction system interface to automatically perform system adjustments (in real-time, based on a threshold when problems are detected, or at some later time) based on historical modifications by user 1360 and pattern analysis by analysis manager 1320.

Figure 14:
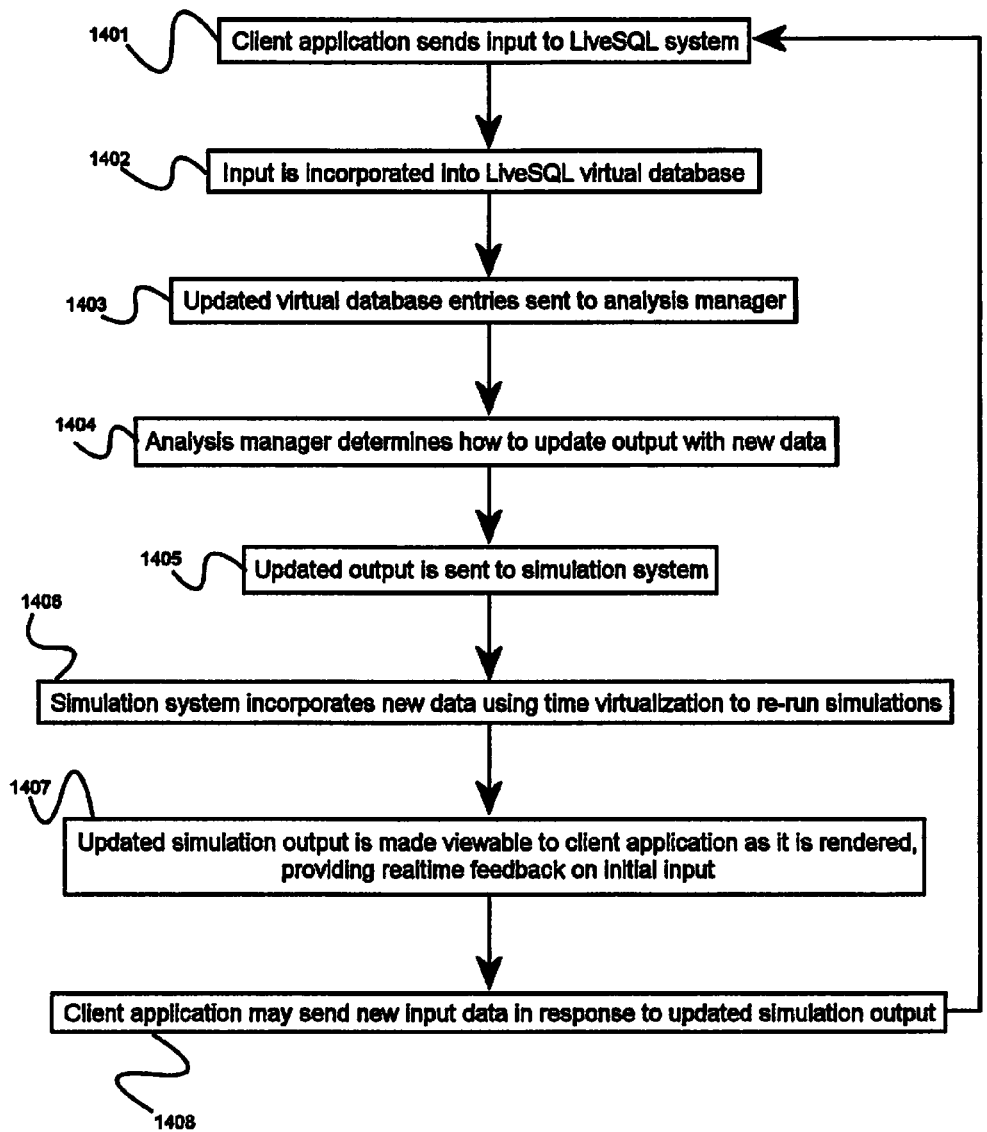
FIG. 14 is a process flow diagram illustrating a method for handling real-time input, according to a preferred embodiment of the invention.

FIG. 14 is a process flow diagram illustrating a method 1400 for handling real-time input, according to a preferred embodiment of the invention. In step 1401, user 1360 sends a request (herein, referred to as "the query") to LiveSQL system 1340 in the form of a query requesting data about, for example, interactions in a communication center environment to analyze agent behaviors in remote centers. Such a query may include data on answer time, length of hold patterns, and time to transfer calls behavior of said agents. In step 1402, the query is incorporated into interaction DB 1341 so that data can be gathered from interactions from communication center environment as described in FIG. 8. Once the process begins, a virtual database and data source-specific virtual table 820 are created in step 1403, as described in FIG. 8, that relate to the data required for the query. In step 1404, analysis manager 1320 determines how to update data source-specific virtual table 820 created in step 1404 with new data as it arrives (for example, triggered by some event). For example, a data source-specific virtual table 820 creates a listener for a data source required to receive the requested data. Once data is updated, step 1405 updates simulations system 1310 with interaction information for the purpose of collecting enough transaction data so that behaviors of interaction, events and objects sop that environment replication 1312 may create a schema to define how simulated interaction traffic may behave when simulated interactions are run through the system by simulation engine 1311. At this point user 1360 can view real interactions (for example, the real traffic in a communication center environment) or alternatively, user 1360 can change parameters to experiment with what-if scenarios. In this case, simulation system 1310 incorporates any new data (for example, a configuration change such as agents added to agent groups, skill changes on agents, etc.) made by user 1360 in step 1406 to run simulations for experimentation using a time virtualized simulation, as described in FIG. 5. In step 1407, a simulated output of, for example, agent behaviors in remote centers, is displayed to GUI 1700 on visualizer 1351 for user 1360 to review. In some embodiments, a real-time view will show in parallel to a real-time simulation. That is real-time interactions will be displayed to GUI 1700 in parallel to a simulated set of interactions depicting the same behavior with the new data (i.e. configuration change). In step 1408, user 1360 may modify other data elements in response to what is seen in visualizer 1351 and may be incorporated into the system and the process begins again at step 1401. In some embodiments, when user 1360 sees a desirable outcome through experimentation, user 1360 can commit changes and analysis manager 1320 interfaces to the interaction management system through interaction management system interface 1321 to commit the changes (for example, configuration changes such as added agent skills and adding agents to agent groups), thus changing the behavior of the real-time system.

Figure 15:
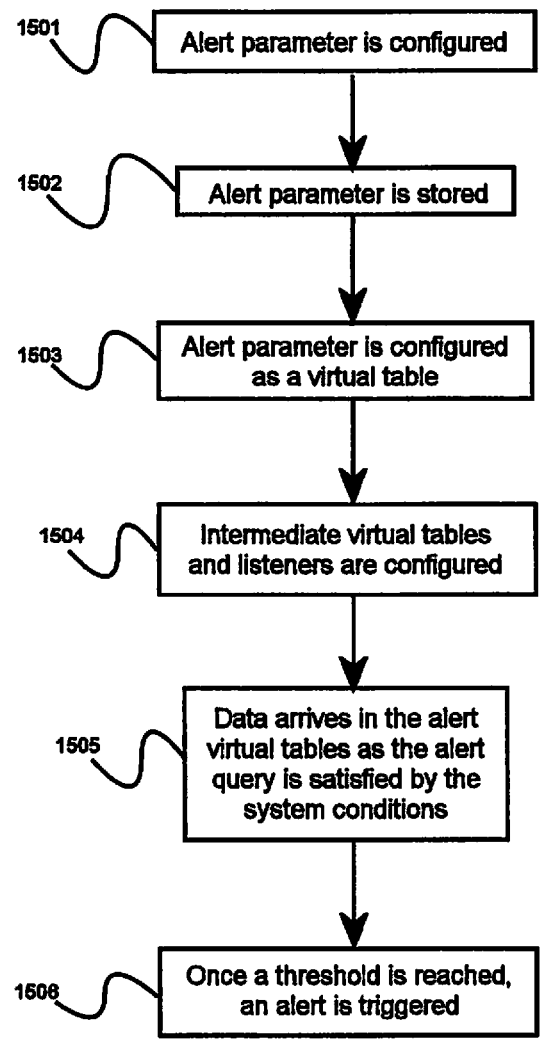
FIG. 15 is a process flow diagram illustrating a method for alert triggering, according to a preferred embodiment of the invention.

FIG. 15 is a process flow diagram illustrating a method 1500 for alert triggering, according to a preferred embodiment of the invention. In step 1501, user 1360 configures an alert parameter (hereinafter referred to as "the alert"). For example, a configuration where if a certain condition is met, one or more action will be performed. In step 1502, the alert is then stored in configuration DB 1331 via configuration system 1330. In step 1503, LiveSQL system 1340 reads the alert and creates an alert virtual table 820 so that as data arrives, alerts can be, for example, monitored against predefined thresholds and may trigger an alert and distributed to one or more visualizer 1360. In some respects, the alert resembles a query where when a cretai query generates a return of data, in essence is the alert itself, for example in a communication center environment, an alert query "SELECT count(1) FROM AgentTable WHERE AgentsAvailable=null" denotes an alert that counts agents that are not available. When the count approaches the number of agents currently on staff, an alert may be generated. In step 1504, all necessary intermediate tables 821 and associated listeners are created to enable the alert virtual table 820 to receive data (as described in FIG. 8). In step 1505 alert virtual table 820 listens for data and receives it as the query parameters are satisfied. Once the data parameters meet the threshold, an alert is sent to user 1360 via Visualizer 1351.

In a particular embodiment, step 1505 monitors simulated interactions delivered from simulation system 1310 in an effort to predict alerts before they happen in the real system or used a method to predict when issues will happen.

In a particular embodiment, step 1505 simultaneously monitors real interactions and simulated interactions to monitor experimentation efforts through "what-if" scenarios.

In a particular embodiment, step 1505 is directly linked to visualizer 1351 so that the progression of alert parameters can be viewed in real-time and user 1360 can react immediately, for example, before an alert happens. In this example, user 1360 would be able to commit changes from the simulated environment if it were, for example, showing or favorable behavior and commit changes to the system, for example, immediately.

Figure 16:
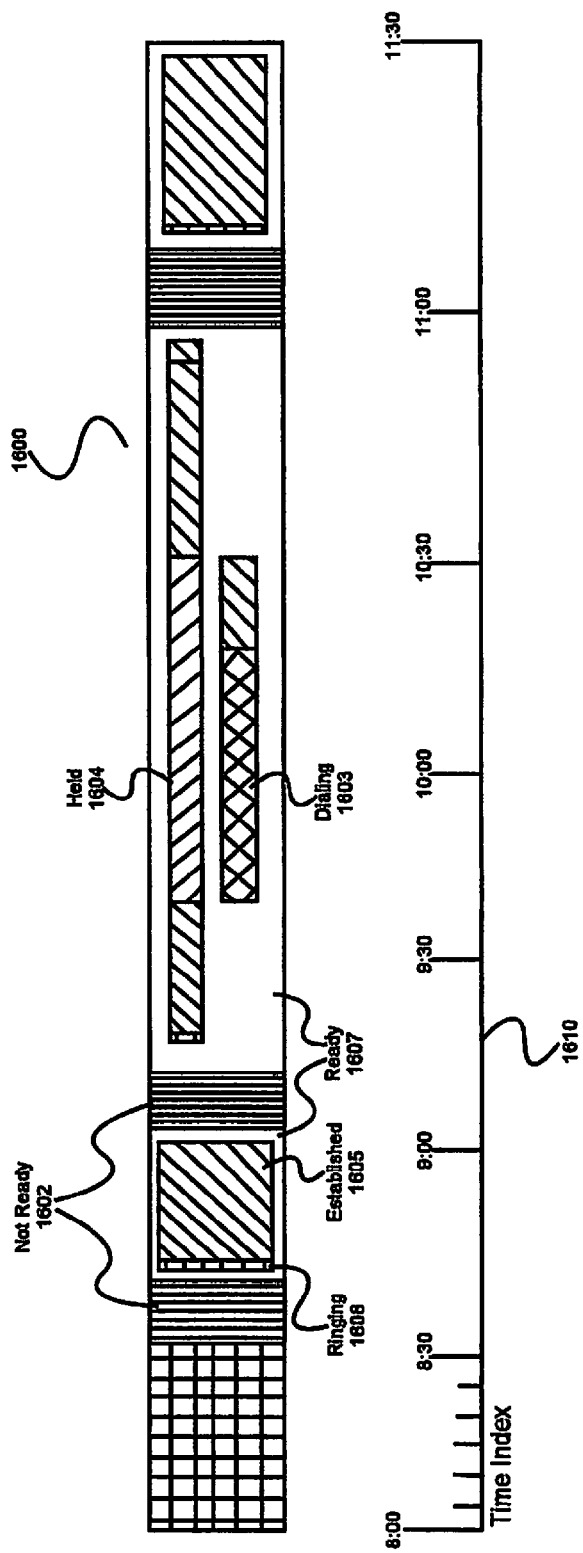
FIG. 16 is a block diagram of a conceptual architecture of a visual interpretation of a set of interactions in an interaction processing environment, according to a preferred embodiment of the invention.

FIG. 16 is a block diagram of a conceptual architecture of a visual interpretation of a set of interactions in an interaction-processing environment, according to a preferred embodiment of the invention. Interaction track 1600 is a visualization of one or more communication objects having one or more interactions that take place in time index 1610. The background patterns of track 1600 represents the state of a communication object. For example, in a communication center environment, object may represent an agent where the state may be logged in, logged out, ready, not ready, or some other communication or object state. In other embodiments, object 1600 may represent a communication device that distributes calls to various other objects, an object may be an email inbox, a VoIP endpoint, a task from a task management system (for example, a Salesforce.com™ task), or some other device capable of processing and/or generating interactions from manual or automatic devices or software processes. Transitions in the background of track 1600 represent a change in state at the corresponding time indicated by time index 1610, for example, track 1600 may represent an agent in a communication center environment taking, for example, customer service telephone calls. At time 8:30 agent 1600 logs into an ACD Queue and is in not ready state 1602, at 9:10, agent 1600 uses call management software (not shown) to make herself ready and the visual representation changes pattern to indicate a transition from not ready 1602 state to ready state 1607.

The foreground boxes of track 1600 represent interactions that take place on object 1600 for one or more interactions at a time interval represented by time index 1610. For example, interactions may include, but are not limited to, ringing 1606 (at an approximate time index 8:45 as denoted by the corresponding position in time index 1610) which represents a notification of an incoming request for communication on a communication device in a communication center environment. In some embodiments, there may be parallel foreground boxes representing simultaneous communications, for example, at an approximate time index of 9:15, agent 1600 receives a ringing event and communication is established shortly thereafter. At an approximate time index 9:32, the interaction is put on hold (that is, the communication is put into a state of temporary interruption without severing the communication connection). While the communication is on hold, agent 1600 initiates a second call, for example, for the purpose of consulting with another agent. To do this, agent 1600 initiates dialing event 1603 (that is, to signal a communication server to initiate an outbound communication). It should be noted that the length of the foreground box relates to the duration of the event as noted by corresponding time index 1610. At approximately 10:10 in time index 1610, a communication is established with the second agent. Once the interaction is complete, as symbolized by the end of the foreground box at time index 10:28, agent 1600 returns to the initial interaction. The transition is noted by the change in pattern between held 1604 and established 1605 it will be appreciated by one having ordinary skill in the art that an established state is where a synchronous conversation is active, for example, when two humans begin a conversation, the interaction is established) at 10:28 in time index 1610.

Figure 17:
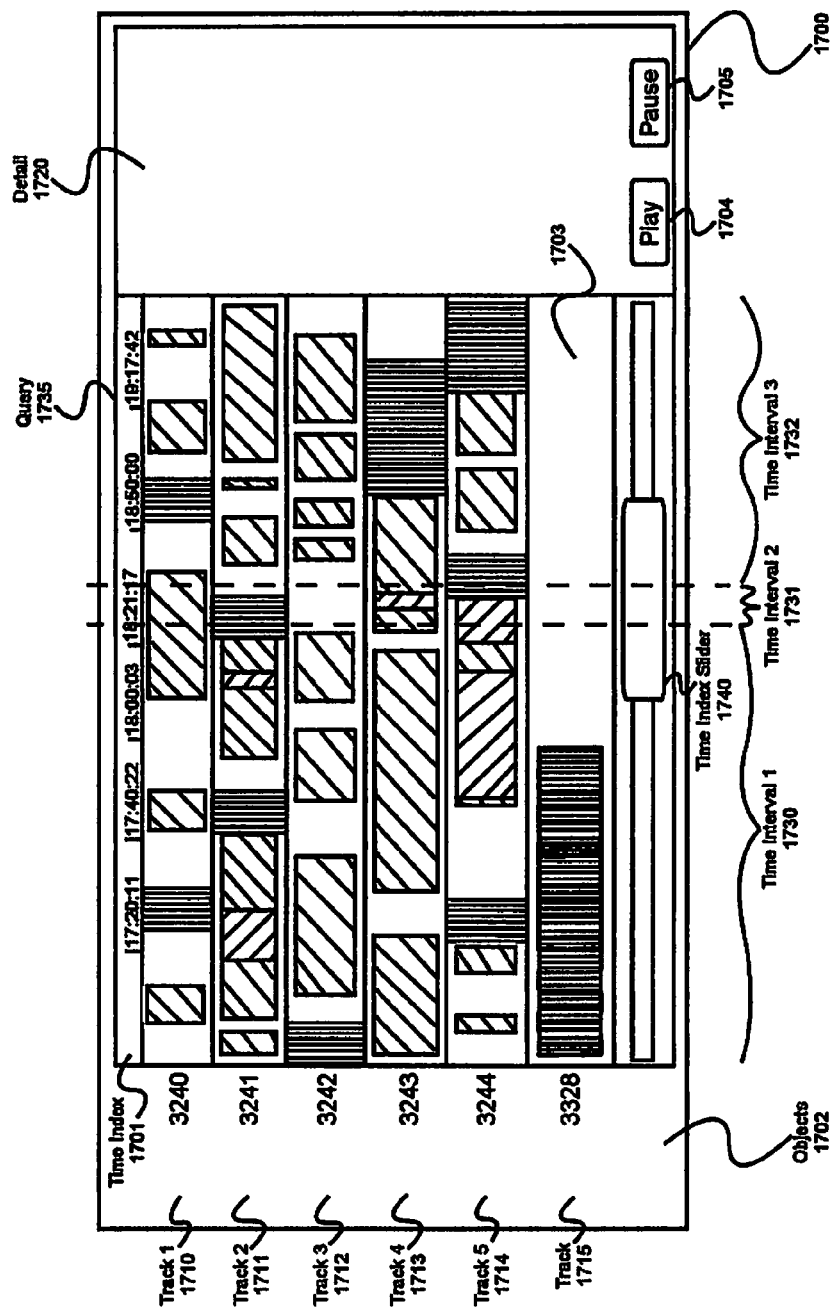
FIG. 17 is a block diagram of a conceptual architecture of a graphical user interface depicting a visual interpretation of communication objects in an interaction processing environment, according to a preferred embodiment of the invention.

FIG. 17 is a block diagram of a conceptual architecture of a graphical user interface depicting a visual interpretation of communication objects in an interaction-processing environment, according to a preferred embodiment of the invention. The invention provides GUI 1700, a graphical user interface that is displayable on user device 1360 (for example, a computer monitor, mobile device, etc.) used to visualize one or more interactions and detailed information on said interactions when, for example, said interactions are selected by user 1360 or some manual or automated process. GUI 1700 is made up of several sections that display different information with respect to communication interactions between humans and/or software processes or a combination of both. User 1360 may visually inspect interaction processes using GUI 1700 for the purpose of analysis of past events, interactions, interaction behavior for improvements of systems, comprehension of behaviors, forecasting of future interaction processing, experimentation by performing what-if scenarios, and other functions used in system 1700 to improve understanding of the interaction system from which LiveSQL system 1340 collected information. Along the left hand column, Objects 1702 is a list of communication objects, for example, a telephone, a video communication device, an email management node, VoIP end point, fax machine, social media communication channel, an electronic representation of a physical communication unit (such as a mailbox), an account, list object, or notification mechanism of a task management system (for example a customer relationship management system such as Seibel™, Saleforce.com™, or the like) or some other communication device for which user 1360 desires to see associated event and interaction information. The main client area 1703 is a group of tracks 1710, 1711, 1712, 1713, 1714, and 1715 representing a plurality of communication objects 1702 and associated interaction and event information. Tracks 1710, 1711, 1712, 1713, 1714, and 1715 has an associated visually-coded track (herein, symbolized by various patterns) indicating interaction and event information associated to the analogous communication object as outlined in FIG. 16. Each track 1710, 1711, 1712, 1713, 1714, and 1715 extends along a time interval denoted by time index 1701. In a preferred embodiment, GUI 1700 shows a subset of time index 1701 where the focus can be changed by time index slider 1740. For example, while time index slider 1740 is in the middle position, GUI 1700 shows interaction and event information for tracks 1710, 1711, 1712, 1713, 1714, and 1715 that took place within time index starting at 16:59:59 to 18:59:59. User 1360 may slide time index slider 1740 using a pointing device, touch screen interface or some other manual or automated process to move the focus to another time interval 1 1730. For example, user 1360 slides time index slider to the left. In this example, GUI 1700 shows interaction and event information for tracks 1710, 1711, 1712, 1713, 1714, and 1715 that took place within a previous time index starting at 14:59:59 to 16:59:59. In a similar example, user 1360 may slide time index slider to the right. In this example, GUI 1700 shows interaction and event information for tracks 1710, 1711, 1712, 1713, 1714, and 1715 that took place within a subsequent time index starting at 18:59:59 to 20:59:59. In some embodiments, time interval 2 1731 corresponds to the present current time, time interval 1 1730 corresponds to the past, and time interval 3 1732 corresponds to the future. In this embodiment, GUI 1700 will show interactions as they happened for tracks 1710, 1711, 1712, 1713, 1714, and 1715 until the present moment (i.e. until the point in time indicated by time interval 2 1731). In this example, time interval 3 1732, may present a future forecast as determined by simulation system 1310. In some embodiments, as real-time progresses, forecasted interaction information may change to real interaction information as it happens on corresponding tracks 1710, 1711, 1712, 1713, 1714, and 1715 for corresponding time index 1701.

In another embodiment, user 1360 may wish to perform experimentation to explore "what-if" scenarios. For example, user 1360 may wish to analyze a problem reported with track 1 1710 (for example, in a communication center environment, a problem was reported where an agent, represented by track 1 1710 was unable to receive calls during a specified period of time). In this example, user 1360 may scroll to a time index 1701 that corresponds to when the issue was reported to have happened. User 1360 may select various events (for example, configuration change events) to appear for the time interval 1 1730 that corresponds to time index 1701 to view a visualization of interactions that took place within time interval 1 1730. In this example user 1360 may have seen that the time index 1701 for a particular a configuration change coincided with the time index 1701 of when the issue was reported to happen. User 1360 may decide to change the configuration element that may have caused the problem and run a "what-if" scenario using simulation system 1310 and review the behavior to verify if the issue happens again. In some embodiments GUI 1700 may show parallel tracks 1710, 1711, 1712, 1713, 1714, and 1715 where tracks 1710, 1711, and 1712 are tracks with actual interaction and event behavior and tracks 1713, 1714, and 1715 are "what-if" tracks of interaction and event behavior, that is the tracks with the simulated behavior generated by simulation system 1310 with the experimental change activated. This delivers an improvement over systems known in the art in that user 1360 may understand the behavior of system 1300 with a much more advanced perspective.

In some embodiments simulation system 1301 may run multiple simultaneous simulations to present a visual representation of multiple combinations and permutations of different configurations to user 1360 for experimentation of system 1300. In this embodiment, user 1360 is able to view a plurality of simulated alternatives simultaneously or through the use of different views using GUI 1700.

When user 1360 runs experiments using simulation system 1310, she may play 1704 (that is, commence the presentation of interaction in client area 1703) and/or pause 1705 (that is, to cease the progression of the display of interactions in client area 1703). For example, user 1360 runs a simulation by making a request to simulation system 1310 by selecting play 1704. When user 1360 reaches a point where she may wish for interactions to stop displaying (for example, to rerun a simulation with different parameters), she may select pause 1705.

User 1360 may select an interaction within tracks 1710, 1711, 1712, 1713, 1714, and 1715, by moving a cursor over certain areas. Once selected, user 1360 may see more detail on the interaction or event in detail section 1720. For example, in a communication center environment, details can include, but are not limited to, identification number of string of the interaction, the name of a person involved with said interaction, access numbers or addresses used to initiate, terminate, or modify said interaction, information, whether location of or identification of hardware units, software processes, and the like, of associated systems that pertain to said interaction, customized data describing aspects or participants, or other entities with respect to said interaction.

In a particular embodiment, user 1360 may use query text box 1735 to filter interaction information within main client area 1703 by using one or more special purpose programming language designed for managing data held in interaction DB 1341. For example an SQL data query such as, "SELECT name, address FROM CustomerData WHERE AgentID='1234'", and exemplary operators outlined in Table 1. In some embodiments data queries may be performed using a proprietary programming language.

Figure 18:
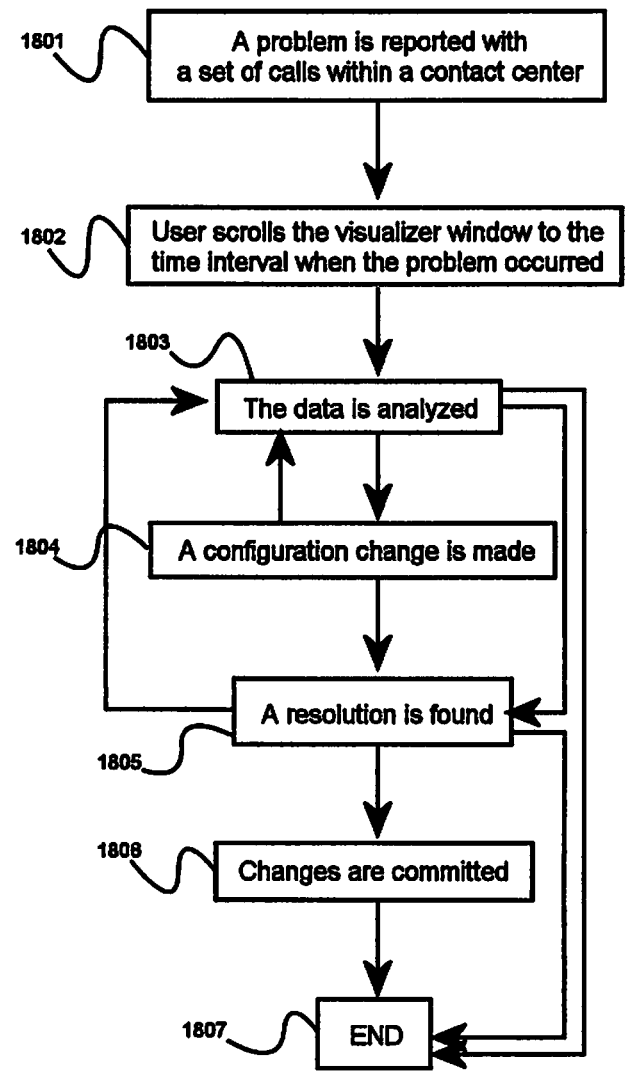
FIG. 18 is a process flow diagram illustrating a method for handling pauses and replays, according to a preferred embodiment of the invention.

FIG. 18 is a process flow diagram illustrating a method for handling pauses and replays, according to a preferred embodiment of the invention. In step 1801, a problem is reported. For example, in a contact center environment, a problem where a set of calls in the contact center are not being properly delivered to agents. In step 1802, user 1360 views the interaction data for the contact center using visualizer 1351. User 1360 scrolls to time interval 1 1730 which contains the time index 1701 that relates to when the issue was reported to have happened. In step 1803, user 1360 analyzes the data in an attempt to determine what may have caused the issue. User 1803 is able to toggle which data elements are visible. For example, she enables the ability to view configurations; ability to see changes in an interaction routing strategy associated to how the interactions moved in the contact center, etc. that were made at the time of the issue. In this example, user 1360 sees that there were several configuration changes that may have caused the issue. In step 1804 a configuration change (for example, adding a new group of agents to the system) is made by user 1360 that may have resulted in a different behavior of the system. The process continues back at step 1803 where user 1360 presses the "play" button (that is, initiates a process so that simulation system 1301 starts to generate interactions in a fashion that mimics the behavior of the contact center but with the different configuration change in place). Through analysis, user 1360 sees that there is no discernible improvement so user 1360 presses "pause" to stop the simulation. In step 1804, user 1360 decides to undo a configuration change (for example, skills were removed from a group of agents) that was made during time interval 1701 that corresponded to when the issue happened. The process reverts back to step 1803 and user presses play again to see the effects of undoing the configuration. This time, the issue is not present and it is determined, in step 1805, that a resolution has been found. Changes are committed to the system in step 1806 and the analysis process ends in step 1807.

In another embodiment, an iterative step may not result in the resolution of a problem so the process ends in step 1807 after analysis step 1803. For example, it is determined that the issue was with an unrelated system.

In another embodiment, a resolution may be found in step 1805 immediately after step 1803 without the need of configuration and the process ends in step 1807.

The skilled person will be aware of a range of possible modifications of the various embodiments described above. Accordingly, the present invention is defined by the claims and their equivalents.

What is claimed is:

1. A system with a dynamic temporal dimension for monitoring and control of contact centers, the system comprising:
   a network-attached server computer comprising a scalable simulation service configured with a virtual environment that replicates and is maintained in synchrony with a production contact center environment;
   a network-attached server computer comprising an analysis manager software module;
   a network-attached server computer comprising a persistent query service coupled to a network-attached data store; and
   a network-attached server computer comprising a visualizer software module;
   wherein the persistent query service receives data from a plurality of contact center systems and updates a plurality of virtual tables based at least on the received data;
   wherein, on receiving a request to create a persistent query from the analysis manager, the persistent query service: creates a query virtual table corresponding to the persistent query; parses the persistent query to create a tree structure representing a logical arrangement of a plurality of operators that yield results required by the persistent query; creates a plurality of intermediate virtual tables corresponding to the plurality of operators, wherein the step of creating an intermediate virtual table further comprises establishing listeners associated with the intermediate virtual table to receive data change notifications; establishes listeners for the query virtual table to receive data change notifications from a plurality of intermediate virtual tables; creates a plurality of data source virtual tables, each corresponding to a specific data source required to fulfill the persistent query; causes the plurality of data source virtual tables to retrieve initial data from the plurality of data sources; and propagates data via the plurality of intermediate virtual tables and their associated listeners to the persistent query virtual table; and
   wherein, on detection of a data change in a data source, the associated data source virtual table invokes a plurality of corresponding methods of listeners of a plurality of virtual intermediate tables and propagates the data change via the plurality of intermediate virtual tables and their associated listeners to the persistent query virtual table, and a client software application executes client code of at least one affected listener;
   wherein the analysis manager, based at least on changes in one or more persistent queries, sends a first plurality of real-time updates to the visualizer and the visualizer thereupon updates a first visualization provided to a user of a state of a production contact center by displaying the first plurality of real-time updates as a set of past states of the production contact center environment; and
   further wherein the scalable simulation service, based at least on changes in one or more persistent queries, performs a time-warped simulation to compute at least a future state of the virtual environments and sends a second plurality of real-time updates to the visualizer and the visualizer thereupon updates the first visualization provided to the user by displaying the second plurality of real-time updates as a projected future state of the production contact center environment.

2. A method for monitoring and control of contact centers with a dynamic temporal dimension, the method comprising the steps of:
   (a) receiving, at a persistent query service stored and operating on a plurality of network-attached computers and coupled to a network-attached data store, data from a plurality of contact center systems;
   (b) updating a plurality of virtual tables based at least on a plurality of received data elements;
   wherein, on receiving a request to create a persistent query from an analysis manager, the persistent query service: creates a query virtual table corresponding to the persistent query; parses the persistent query to create a tree structure representing a logical arrangement of a plurality of operators that yield results required by the persistent query; creates a plurality of intermediate virtual tables corresponding to the plurality of operators, wherein the step of creating an intermediate virtual table further comprises establishing listeners associated with the intermediate virtual table to receive data change notifications; establishes listeners for the query virtual table to receive data change notifications from a plurality of intermediate virtual tables; creates a plurality of data source virtual tables, each corresponding to a specific data source required to fulfill the persistent query; causes the plurality of data source virtual tables to retrieve initial data from the plurality of data sources; and propagates data via the plurality of intermediate virtual tables and their associated listeners to the persistent query virtual table; and
   wherein, on detection of a data change in a data source, the associated data source virtual table invokes a plurality of corresponding methods of listeners of a plurality of virtual intermediate tables and propagates the data change via the plurality of intermediate virtual tables and their associated listeners to the persistent query virtual table, and a client software application executes client code of at least one affected listener;
   (c) sending, using an analysis manager stored and operating on a network-attached computer, based at least on changes in one or more persistent queries, a first plurality of real-time updates to a visualizer stored and operating on a network-connected computer;
   (d) updating, by the visualizer, a first visualization provided to a user of a state of a production contact center by displaying the first plurality of real-time updates as a set of past states of the production contact center environment;
   (e) performing, using a scalable simulation service stored and operating on a plurality of network-attached computers and configured with a virtual environment that replicates and is maintained in synchrony with a production contact center environment, a time-warped simulation to compute at least a future state of one of the virtual environments based at least on changes in one or more persistent queries;
   (f) sending the second plurality of real-time updates to the visualizer; and
   (g) updating, by the visualizer, the first visualization provided to the user by displaying the second plurality of real-time updates as a projected future state of the production contact center environment.

* * * * *